(12) United States Patent
Kurose et al.

(10) Patent No.: US 12,117,902 B2
(45) Date of Patent: *Oct. 15, 2024

(54) MEMORY SYSTEM

(71) Applicant: KIOXIA CORPORATION, Tokyo (JP)

(72) Inventors: Kengo Kurose, Tokyo (JP); Masanobu Shirakawa, Kanagawa (JP); Marie Takada, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/324,226

(22) Filed: May 26, 2023

(65) Prior Publication Data

US 2023/0297473 A1  Sep. 21, 2023

Related U.S. Application Data

(63) Continuation of application No. 17/718,969, filed on Apr. 12, 2022, now Pat. No. 11,698,834, which is a
(Continued)

(30) Foreign Application Priority Data

Mar. 19, 2019 (JP) ................. 2019-051530

(51) Int. Cl.
  *G06F 11/10* (2006.01)
  *G11C 11/56* (2006.01)
  (Continued)

(52) U.S. Cl.
  CPC ...... *G06F 11/1068* (2013.01); *G11C 11/5642* (2013.01); *G11C 11/5671* (2013.01); *G11C 16/0483* (2013.01); *G11C 16/26* (2013.01)

(58) Field of Classification Search
  None
  See application file for complete search history.

(56) References Cited

U.S. PATENT DOCUMENTS 8,631,191 B2   1/2014  Hashimoto
9,070,479 B2 *  6/2015  Sharon ................. G11C 29/04
(Continued)

FOREIGN PATENT DOCUMENTS

JP   2012-198869 A   10/2012
JP   2015-133161 A    7/2015
JP   2020-47318 A     3/2020

OTHER PUBLICATIONS

C. Yang, Y. Emre and C. Chakrabarti, "Product Code Schemes for Error Correction in MLC NAND Flash Memories," in IEEE Transactions on Very Large Scale Integration (VLSI) Systems, vol. 20, No. 12, pp. 2302-2314, Dec. 2012, doi: 10.1109/TVLSI.2011. 2174389 (Year: 2012).

(Continued)

*Primary Examiner* — Daniel F. McMahon
(74) *Attorney, Agent, or Firm* — Oblon, McClelland, Maier & Neustadt, L.L.P.

(57) ABSTRACT

According to an embodiment, a memory controller obtains first data in a first page using a first voltage, obtains a first shift amount based on a first and second number. The first and second numbers represent numbers of bits each of which has different values in a first and second manner between the first data and first expected data. The controller obtains second data in the second page using a second voltage and a second shift amount, and obtains a third shift amount based on a third and fourth number, the third and fourth numbers respectively represent numbers of bits each of which has different values in the first and second manner between the second data and second expected data.

18 Claims, 16 Drawing Sheets

Related U.S. Application Data continuation of application No. 17/092,054, filed on Nov. 6, 2020, now Pat. No. 11,334,432, which is a continuation of application No. 16/550,355, filed on Aug. 26, 2019, now Pat. No. 10,866,860.

(51) Int. Cl.
    *G11C 16/04*     (2006.01)
    *G11C 16/26*     (2006.01)

(56) References Cited

U.S. PATENT DOCUMENTS

| | | | | |
|---|---|---|---|---|
| 9,171,629 | B1* | 10/2015 | Kokubun | G11C 11/5628 |
| 10,553,289 | B1* | 2/2020 | De Santis | G11C 16/32 |
| 2008/0013380 | A1* | 1/2008 | Cornwell | G11C 16/3431 |
| | | | | 365/185.21 |
| 2008/0109702 | A1* | 5/2008 | Brandman | G06F 11/1072 |
| | | | | 714/763 |
| 2008/0109703 | A1* | 5/2008 | Brandman | G06F 11/1068 |
| | | | | 714/763 |
| 2013/0024605 | A1* | 1/2013 | Sharon | G11C 29/78 |
| | | | | 711/E12.008 |
| 2013/0094288 | A1* | 4/2013 | Patapoutian | G11C 16/06 |
| | | | | 365/185.18 |
| 2013/0185606 | A1* | 7/2013 | Fai | G11C 11/406 |
| | | | | 714/704 |
| 2013/0297988 | A1* | 11/2013 | Wu | G06F 11/1048 |
| | | | | 714/773 |
| 2016/0322113 | A1 | 11/2016 | Parker | |
| 2017/0077950 | A1 | 3/2017 | Pavlov et al. | |
| 2018/0090212 | A1 | 3/2018 | Konno et al. | |
| 2019/0278655 | A1* | 9/2019 | Koudele | G06F 3/0659 |
| 2019/0294367 | A1* | 9/2019 | Takada | G11C 16/08 |
| 2019/0362796 | A1* | 11/2019 | Choi | G11C 16/14 |
| 2020/0090763 | A1 | 3/2020 | Tokutomi et al. | |

OTHER PUBLICATIONS

Y. Cai, S. Ghose, E. F. Haratsch, Y. Luo and 0. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).

* cited by examiner

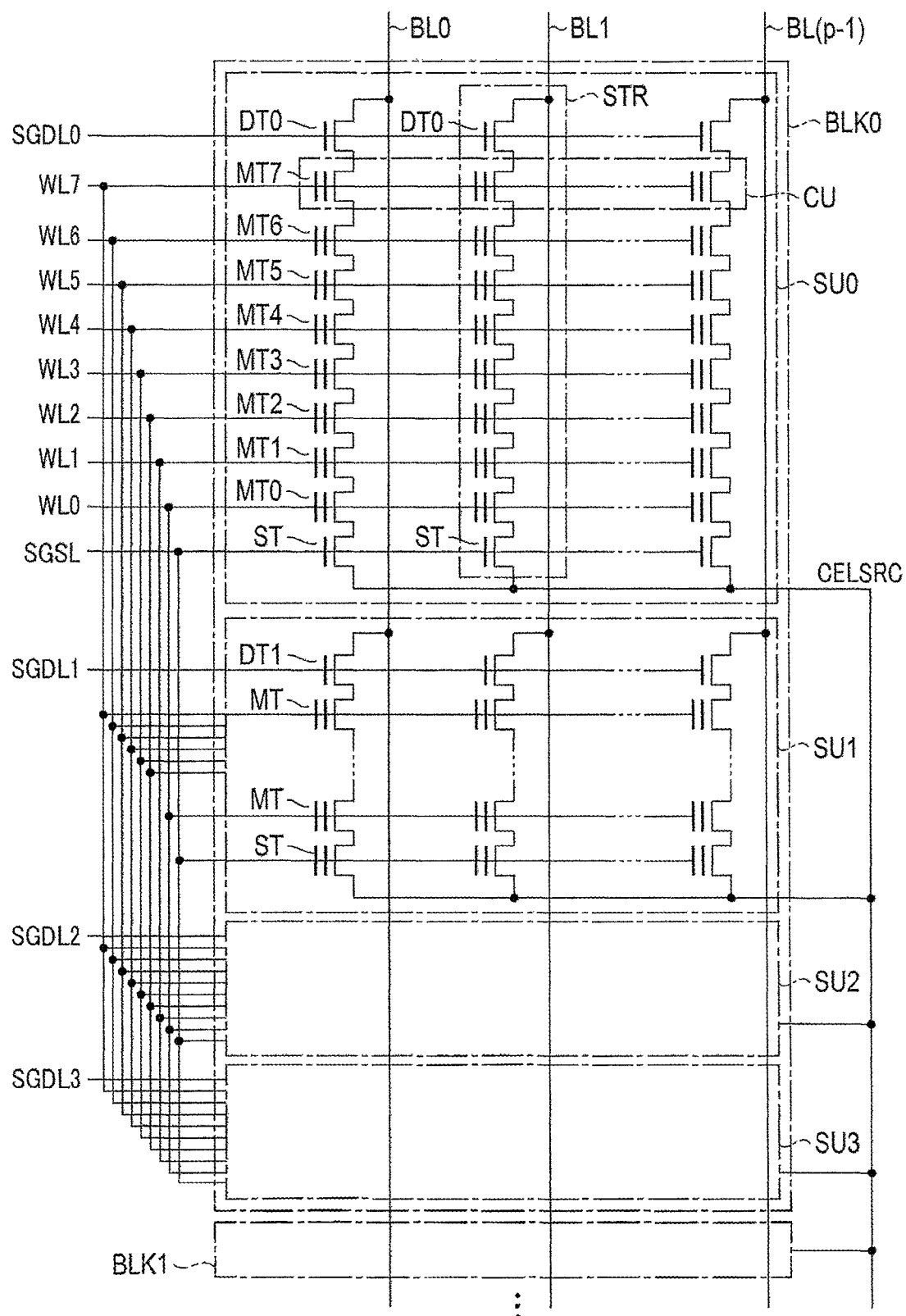
F I G. 2

| BLK | WL | SU | AR | BR | CR | ......... | OR |
|-----|----|----|----|----|----|-----------|----|
| 0 | 0 | 0 | $\Delta VA0$ | $\Delta VB0$ | $\Delta VC0$ | | $\Delta VO0$ |
| 0 | 0 | 1 | $\Delta VA1$ | $\Delta VB1$ | $\Delta VC1$ | | $\Delta VO1$ |
| | | | | ⋮ | | | |

F I G. 4

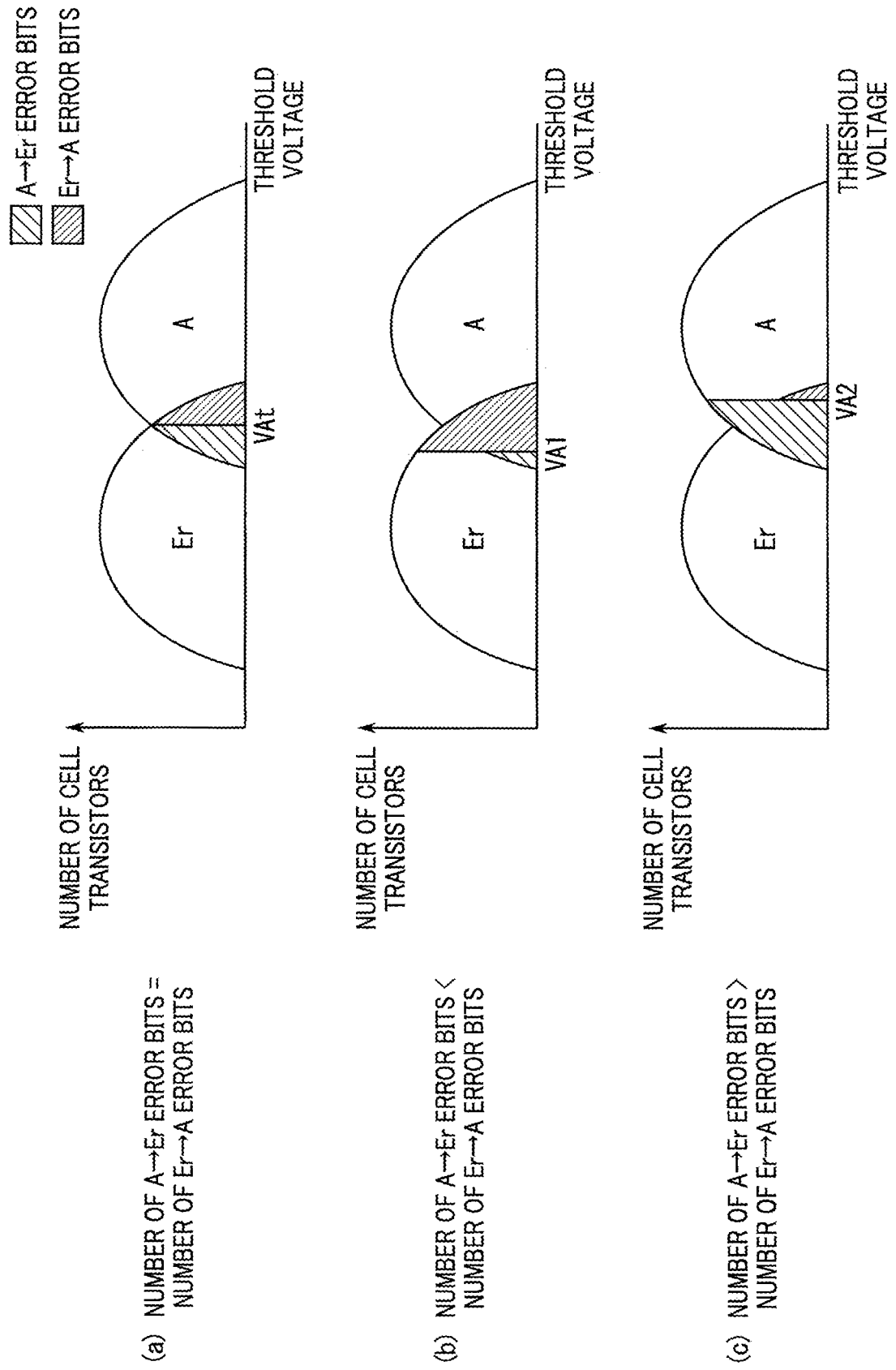
F I G. 7

| RAT | ESTIMATED SHIFT AMOUNT |
|---|---|
| 10 < RAT | 5 |
| 8 < RAT ≦ 10 | 4 |
| 4 < RAT ≦ 8 | 3 |
| 2 < RAT ≦ 4 | 2 |
| 1 < RAT ≦ 2 | 1 |
| RAT = 1 | 0 |
| 0.5 < RAT < 1 | −1 |
| 0.25 < RAT ≦ 0.5 | −2 |
| 0.125 < RAT ≦ 0.25 | −3 |
| 0.1 < RAT ≦ 0.125 | −4 |
| RAT ≦ 0.1 | −5 |

FIG. 9

|  | ER | FR | GR |
|---|---|---|---|
| SHIFT AMOUNT | 0 | 0 | 0 |
| RATIO RAT | 0.27 | × | 0 |
| ESTIMATED SHIFT AMOUNT | −1 | × | −5 |

APPLICATION ↰  ↱ APPLICATION

⇩

|  | ER | FR | GR |
|---|---|---|---|
| SHIFT AMOUNT | 0 | 0 | 0 |
| RATIO RAT | 0.27 | × | 0 |
| ESTIMATED SHIFT AMOUNT | −1 | −3 | −5 |

F I G. 12

F I G. 16

MEMORY SYSTEM

CROSS-REFERENCE TO RELATED APPLICATIONS

This application is a continuation of and claims benefit under 35 U.S.C. § 120 to U.S. application Ser. No. 17/718,969, filed Apr. 12, 2022, which is a continuation of and claims benefit under 35 U.S.C. § 120 to U.S. application Ser. No. 17/092,054, filed Nov. 6, 2020, which is a continuation of and claims benefit under 35 U.S.C. § 120 to U.S. application Ser. No. 16/550,355, filed Aug. 26, 2019, which is based upon and claims the benefit of priority under 35 U.S.C. § 119 from Japanese Patent Application No. 2019-051530, filed Mar. 19, 2019, the entire contents of each of which are incorporated herein by reference.

FIELD

Embodiments described herein relate generally to a memory system.

BACKGROUND

A memory system including a semiconductor memory and a controller that controls the semiconductor memory is known.

BRIEF DESCRIPTION OF THE DRAWINGS

FIG. 2 shows an example of components and connections of blocks, according to the first embodiment.

FIG. 4 shows an example of a shift amount table according to the first embodiment.

FIG. 7 shows examples of threshold voltage distributions of memory cell transistors and read voltages, according to the first embodiment.

FIG. 9 shows an example of correspondence between ratios and shift amounts, according to the first embodiment.

FIG. 12 shows an example of applications of updated shift amounts in the memory controller according to the first embodiment.

FIG. 16 shows another example of applications of updated shift amounts according to the modification of the first embodiment.

DETAILED DESCRIPTION

Figure 1:
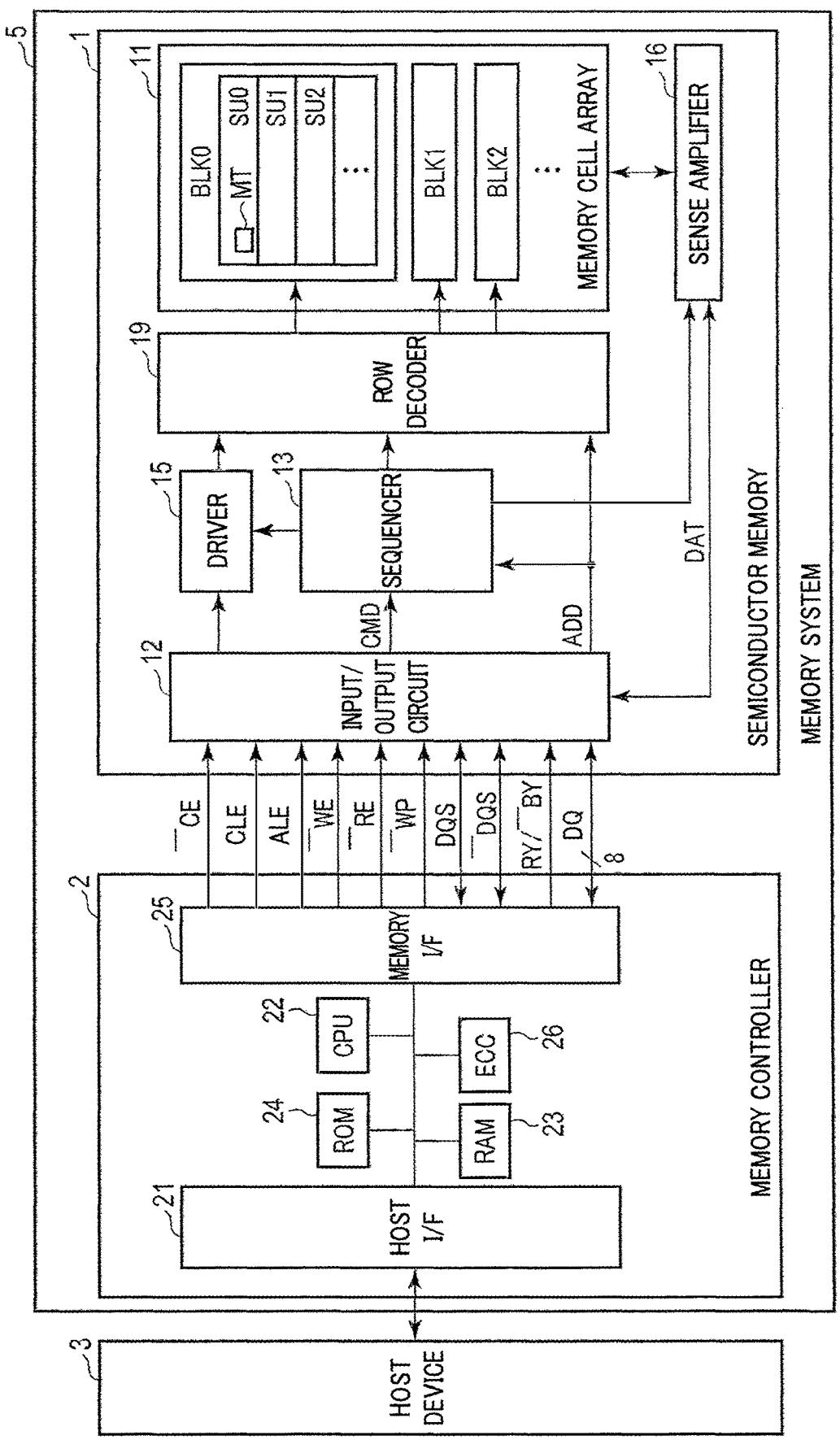
FIG. 1 is a block diagram showing components and connections in a memory system according to a first embodiment, and associated components.

In general, according to an embodiment, a memory system includes a memory device and a memory controller. The memory device includes a memory cell set and is configured to store data in each of a first page and a second page of the memory cell set. The memory controller configured to obtain first data by determining data stored in the first page using a first voltage, and obtain a first shift amount based on a first number and a second number. The first number represents a number of bits each of which has different values in a first manner between the first data and first expected data obtained by error correction on the first data. The second number representing a number of bits each of which has different values in a second manner between the first data and the first expected data. The memory controller is further configured to obtain second data by determining data stored in the second page using a second voltage and a second shift amount. The second shift amount is based on the first shift amount. The memory controller is further configured to obtain a third shift amount based on a third number and a fourth number. The third number represents a number of bits each of which has different values in the first manner between the second data and second expected data obtained by error correction on the second data. The fourth number represents a number of bits each of which has different values in the second manner between the second data and the second expected data.

Embodiments will now be described with reference to the figures. In the following description, components with substantially the same functionalities and configurations will be referred to with the same reference numerals, and repeated descriptions may be omitted. Each functional block can be implemented as hardware, computer software, or combination of the both. For this reason, in order to clearly illustrate that each block can be any of hardware, software or combination thereof, descriptions will be made in terms of their functionalities in general. It is not necessary that functional blocks are distinguished as in the following examples. For example, some of the functions may be implemented by functional blocks different from those illustrated below. Furthermore, an illustrated functional block may be divided into functional sub-blocks. The embodiments are not limited by the details on how functional blocks are distinguished.

Moreover, any step in a flow of a method of an embodiment is not limited to any illustrated order, and can occur in an order different from an illustrated order and/or can occur concurrently with another step.

In the specification and the claims, a phrase of a particular first component "being coupled" to another second component includes the first component being coupled to the second component either directly or via one or more components which are always or selectively conductive.

First Embodiment

1.1. Structure (Configuration)

FIG. 1 shows components and connections in a memory system according to the first embodiment and associated components. As shown in FIG. 1, a memory system 5 is controlled by a host device 3 and includes a memory device 1 and a memory controller 2. The memory system 5 can be, for example, a solid state drive (SSD) or SD™ card.

The memory controller 2 controls the memory device 1. The memory controller 2 receives instructions from the host device 3, and controls the memory device 1 based on the received instructions.

1.1.1. Memory Controller

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 executes various operations and some of the functions of the host interface 21 and the memory interface 25 by causing the CPU 22 to execute firmware (or, programs) stored in the ROM 24 and loaded in the RAM 23. The RAM 23 further temporarily stores data and functions as a buffer memory and a cash memory. The RAM 23 further stores a shift amount table, which will be described below.

The host interface 21 is connected to the host device 3 via a bus and controls communications between the memory controller 2 and the host device 3. The memory interface 25 is connected to the memory device 1 and controls communications between the memory controller 2 and the memory device 1.

The ECC circuit 26 subjects data written into and read from the memory device 1 to a process necessary for detection and correction of errors. Specifically, the ECC circuit 26 performs an error-correction coding process on data (substantial write data) that will be written into the memory device 1. Depending on the scheme for generating error-correcting codes, the error-correction coding may generate redundant data for error correction separately from the substantial data, or data that contains error correction information (redundant data) and that is different from the substantial write data. The redundant-data containing data obtained by the error-correction coding is written into the memory device 1 as write data. The ECC circuit 26 detects an error in data read from the memory device 1, and attempts to correct errors, if any.

1.1.2. Memory Device

The memory device 1 includes components such as a memory cell array 11, an input and output circuit 12, a sequencer 13, a driver 15, a sense amplifier 16, and a row decoder 19.

The memory cell array 11 includes memory blocks BLK such as BLK0, BLK1, . . . Each block BLK is a set of string units SU such as SU0, SU1, . . . Each string unit SU is a set of NAND strings STR such as STR0, STR1, . . . (not shown). The string STR includes memory cell transistors MT.

The input and output circuit 12 is connected to the memory controller 2 via a NAND bus. The NAND bus transmits control signals and a signal DQ having a width of eight bits. The control signals include signals ⁻CE, CLE, ALE, ⁻WE, ⁻RE, and ⁻WP and data strobe signals DQS and ⁻DQS. The symbol "⁻" indicates inverted logic. The input and output circuit 12 receives and transmits the signal DQ. The input and output circuit 12 receives some control signals from the memory controller 2 and fetches and outputs the signal DQ based on the control signals. The signal DQ includes a command (CMD), write or read data (DAT), address (ADD), and status (STA).

The sequencer 13 receives the command CMD and the address ADD from the input and output circuit 12, and controls the driver 15, the sense amplifier 16, and the row decoder 19 based on the command CMD and the address ADD.

The driver 15 supplies a selected one of potentials to the row decoder 19. The row decoder 19 receives various potentials from the driver 15 and the address ADD from the input and output circuit 12, and transfers the potential from the driver 15 to one block BLK selected based on the received address ADD.

The sense amplifier 16 senses a state of memory cell transistors MT, generates read data based on the sensed state, and transfers write data to the memory cell transistors MT.

1.1.3. Memory Cell Array

FIG. 2 shows an example of several components and connections in the memory cell array 11 according to the first embodiment, and shows components and connections in one block BLK0 and associated components. Each of a plurality of blocks BLK, for example, all blocks BLK, includes the components and the connections shown in FIG. 2.

One block BLK includes a plurality of (for example, four) string units SU0 to SU3.

In each block BLK, each of p (where p is a natural number) bit lines BL0 to BL(p−1) is connected to one string STR from each of the string units SU0 to SU3.

Each string STR includes one select gate transistor ST, a plurality of, for example, eight memory cell transistors MT such as MT0 to MT7, and one select gate transistor DT such as DT0, DT1, DT2, or DT3. The transistors ST, MT, and DT are serially coupled in this order between a source line CELSRC and one bit line BL. A memory cell transistor MT includes a control gate electrode (word line WL) and a charge storage layer insulated from the surroundings, and can store data in a nonvolatile manner based on the amount of charge in the charge storage layer.

Strings STR respectively coupled to different bit lines BL make one string unit SU. In each string unit SU, the control gate electrodes of the memory cell transistors MT0 to MT7 are respectively coupled to word lines WL0 to WL7. A set of memory cell transistors MT sharing a word line WL in one string unit SU is referred to as a cell unit (or, memory cell set) CU.

The transistors DT0 to DT3 (DT2 and DT3 not shown in FIG. 2) respectively belong to string units SU0 to SU3. Gates of the transistors DT0 of the strings STR of the string unit SU0 are coupled to a selected gate line SGDL0. Similarly, gates of the transistors DT1, DT2, and DT3 of the strings STR of the string units SU1, SU2, and SU3 are respectively coupled to selected gate lines SGDL1, SGDL2, and SGDL3.

1.1.4. Cell Transistors

Figure 3:
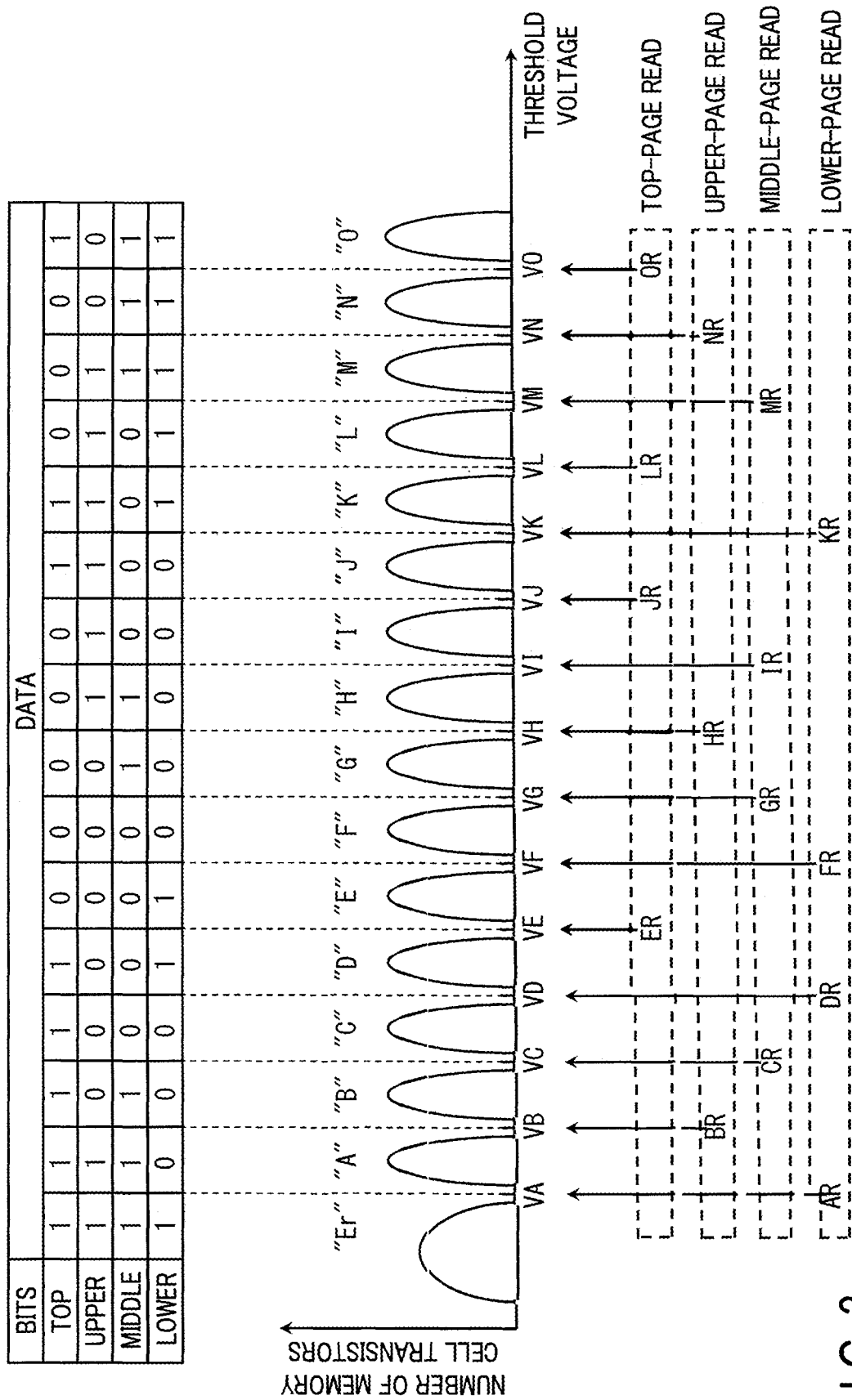
FIG. 3 shows distributions of threshold voltages of memory cell transistors each storing 4-bit data, according to the first embodiment.

The memory cell transistors MT will be described with reference to FIG. 3. The memory device 1 can store data of two bits or more in one memory cell transistor MT. FIG. 3 shows distributions of the threshold voltages of the memory cell transistors MT each storing four-bit data as a result of a data write operation in the memory system 5, according to the first embodiment. The threshold voltage of each memory cell transistor MT has a value corresponding to the stored data. When storing four-bit data per memory cell transistor MT, each memory cell transistor MT can have one of 16 threshold voltages. The 16 threshold voltages respectively correspond to states of storing "1111" data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data. The memory cell transistors MT respectively storing "1111" data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data are referred to as being in Er, A, B, C, D, E, F, G, H, I, J, K, L, M, N, and O states. The memory cell transistors MT in Er, A, B, C, D, E, F, G, H, I, J, K, L, M, N, and O states respectively have higher threshold voltages in this order.

A write operation keeps a write target memory cell transistor MT in Er state, or brings the write target memory cell transistor MT to one of A, B, C, D, E, F, G, H, I, J, K, L, M, N, and O states, according to data to be written. A memory cell transistor MT in Er state is a memory cell transistor MT that does not increase in threshold voltage even by a write operation; however, keeping a memory cell transistor MT in Er state as a result of a write operation will be also referred to as a write operation.

Even a plurality of memory cell transistors MT that store identical four-bit data can have different threshold voltages due to variations in the characteristics of the memory cell transistors MT.

In order to determine the data stored in a memory cell transistor MT as a read target, or a selected memory cell transistor, the state of the memory cell transistor MT is determined. The state of the selected memory cell transistor MT is determined based on which range the threshold voltage of the selected memory cell transistor MT falls within. In order to determine the range within which the threshold voltage of the selected memory cell transistor MT falls, it is determined whether or not the selected memory cell transistor MT has a threshold voltage that exceeds a read voltage VCGR. The memory cell transistor MT having a threshold voltage equal to or higher than the read voltage VCGR maintains an OFF state even while receiving the read voltage VCGR at its control gate electrode. In contrast to this, the memory cell transistor MT having a threshold voltage lower than the read voltage VCGR is turned on while receiving the read voltage VCGR at its control gate electrode.

Read operations for determining whether or not the selected memory cell transistor MT is in a higher-voltage state than Er, A, B, C, D, E, F, G, H, I, J, K, L, M, and N states will be respectively referred to as "AR", "BR", "CR", "DR", "ER", "FR", "GR", "HR", "IR", "JR", "KR", "LR", "MR", "NR", and "OR". Read voltages VA, VB, VC, VD, VE, VF, VG, VH, VI, VJ, VK, VL, VM, VN, and VO may be respectively used in AR, BR, CR, DR, ER, FR, GR, HR, IR, JR, KR, LR, MR, NR, and OR. The read voltages VA, VB, VC, VD, VE, VF, VG, VH, VI, VJ, VK, VL, VM, VN, and VO are of, for example, default magnitudes.

The read voltage VA is higher than the highest threshold voltage of the memory cell transistor MT in Er state, and is lower than the lowest threshold voltage of the memory cell transistor MT in A state immediately after the write operation.

The read voltage VB is higher than the highest threshold voltage of the memory cell transistor MT in A state immediately after the write operation, and is lower than the lowest threshold voltage of the memory cell transistor MT in B state immediately after the write operation.

The read voltage VC is higher than the highest threshold voltage of the memory cell transistor MT in B state immediately after the write operation, and is lower than the lowest threshold voltage of the memory cell transistor MT in C state immediately after the write operation.

The read voltage VD is higher than the highest threshold voltage of the memory cell transistor MT in C state immediately after the write operation, and is lower than the lowest threshold voltage of the memory cell transistor MT in D state immediately after the write operation.

The read voltage VE is higher than the highest threshold voltage of the memory cell transistor MT in D state immediately after the write operation, and is lower than the lowest threshold voltage of the memory cell transistor MT in E state immediately after the write operation.

The read voltage VF is higher than the highest threshold voltage of the memory cell transistor MT in E state immediately after the write operation, and is lower than the lowest threshold voltage of the memory cell transistor MT in F state immediately after the write operation.

The read voltage VG is higher than the highest threshold voltage of the memory cell transistor MT in F state immediately after the write operation, and is lower than the lowest threshold voltage of the memory cell transistor MT in G state immediately after the write operation.

The read voltage VH is higher than the highest threshold voltage of the memory cell transistor MT in G state immediately after the write operation, and is lower than the lowest threshold voltage of the memory cell transistor MT in H state immediately after the write operation.

The read voltage VI is higher than the highest threshold voltage of the memory cell transistor MT in H state immediately after the write operation, and is lower than the lowest threshold voltage of the memory cell transistor MT in I state immediately after the write operation.

The read voltage VJ is higher than the highest threshold voltage of the memory cell transistor MT in I state immediately after the write operation, and is lower than the lowest threshold voltage of the memory cell transistor MT in J state immediately after the write operation.

The read voltage VK is higher than the highest threshold voltage of the memory cell transistor MT in J state immediately after the write operation, and is lower than the lowest threshold voltage of the memory cell transistor MT in K state immediately after the write operation.

The read voltage VL is higher than the highest threshold voltage of the memory cell transistor MT in K state immediately after the write operation, and is lower than the lowest threshold voltage of the memory cell transistor MT in L state immediately after the write operation.

The read voltage VM is higher than the highest threshold voltage of the memory cell transistor MT in L state immediately after the write operation, and is lower than the lowest threshold voltage of the memory cell transistor MT in M state immediately after the write operation.

The read voltage VN is higher than the highest threshold voltage of the memory cell transistor MT in M state immediately after the write operation, and is lower than the lowest threshold voltage of the memory cell transistor MT in N state immediately after the write operation.

The read voltage VO is higher than the highest threshold voltage of the memory cell transistor MT in N state immediately after the write operation, and is lower than the lowest threshold voltage of the memory cell transistor MT in O state immediately after the write operation.

A set of data of bits at the same position (digit) of the memory cell transistors MT of one cell unit CU constitutes one page. A set of data of bits at the most significant (first digit) position of the memory cell transistors MT of each cell unit CU is referred to as a top page. A set of data of bits at the second digit from the most significant digit of the memory cell transistors MT of each cell unit CU is referred to as an upper page. A set of data of bits at the third digit from the most significant digit of the memory cell transistors MT of each cell unit CU is referred to as a middle page. A set of data of bits at the least significant (fourth digit) position of the memory cell transistors MT of each cell unit CU is referred to as a lower page.

Data in each page is determined by a read operation using a plurality of read voltages with different magnitudes. An example will be described below. The state of each bit of the lower page is determined by AR, DR, FR, and KR. The state of each bit of the middle page is determined by CR, GR, IR, and MR. The state of each bit of the upper page is determined by BR, HR, and NR. The state of each bit of the top page is determined by ER, JR, LR, and OR.

1. 2. Operation

In the description that follows, the symbols "X" and "Z" will be introduced. The symbol "X" represents only one of A, B, C, D, E, F, G, H, I, J, K, L, M, N, and O as a representative, but also includes each of cases where "X" is the remaining ones of A, B, C, D, E, F, G, H, I, J, K, L, M, N, and O. For example, the notation "XR" represents only one of AR, BR, CR, DR, ER, FR, GR, HR, IR, JR, KR, LR, MR, NR, and OR (for example, AR), but the description on XR applies to each of all remaining ones of AR, BR, CR, DR, ER, FR, GR, HR, IR, JR, KR, LR, MR, NR, and OR (for example, BR, CR, DR, ER, FR, GR, HR, IR, JR, KR, LR, MR, NR, and OR).

The symbol "Z" represents only inclusion one of A, B, C, D, E, F, G, H, I, J, K, L, M, N, and O as a representative, but also includes each of cases where "Z" is only one or more of the remaining ones of A, B, C, D, E, F, G, H, I, J, K, L, M, N, and O. For example, the notation "ZR" represents only one of AR, BR, CR, DR, ER, FR, GR, HR, IR, JR, KR, LR, MR, NR, and OR (for example, AR), but the description on ZR applies to each of only one or more of the remaining ones of AR, BR, CR, DR, ER, FR, GR, HR, IR, JR, KR, LR, MR, NR, and OR (for example, BR and CR).

1. 2. 1. Shift Amount Table

FIG. 4 shows an example of a shift amount table. The memory controller 2 keeps storing the shift amount table on the RAM 23 while receiving, for example, a power supply. The shift amount table may be updated from time to time. The shift amount table contains entries for, for example, each string unit SU. FIG. 4 shows entries, which are, for example, values regarding a string unit SU of a word line WL of a block BLK. Each of the entries includes shift amounts $\Delta VA$, $\Delta VB$, $\Delta VC$, $\Delta VD$, $\Delta VE$, $\Delta VF$, $\Delta VG$, $\Delta VH$, $\Delta VI$, $\Delta VJ$, $\Delta VK$, $\Delta VL$, $\Delta VM$, $\Delta VN$, and $\Delta VO$, which may be respectively used in AR, BR, CR, DR, ER, FR, GR, HR, IR, JR, KR, LR, MR, NR, and OR. For example, an entry of string unit SU0 of word line WL0 of block BLK0 includes shift amounts $\Delta VA0$, $\Delta VB0$, $\Delta VC0$, $\Delta VD0$, $\Delta VE0$, $\Delta VF0$, $\Delta VG0$, $\Delta VH0$, $\Delta VI0$, $\Delta VJ0$, $\Delta VK0$, $\Delta VL0$, $\Delta VM0$, $\Delta VN0$, and $\Delta VO0$, which are respectively for AR, BR, CR, DR, ER, FR, GR, HR, IR, JR, KR, LR, MR, NR, and OR.

A shift amount $\Delta VX$ is added to a default read voltage VX, and a read voltage VX+$\Delta VX$ is used in XR. The memory controller 2 notifies the memory device 1 of one or more shift amounts $\Delta VX$, along with a read instruction. Upon receiving the read instruction and the shift amount $\Delta VX$, the memory device 1 performs XR using the read voltage VX+$\Delta VX$. The shift amount $\Delta VX$ may be either a positive value, zero, or a negative value.

The shift amount $\Delta VX$ may be expressed by, for example, a digital-to-analog converter (DAC) value.

The entries may be prepared in units different from those of the above-described example. For example, the entries may be common to the string units SU0 to SU3, and/or common to a plurality of word lines WL.

1. 2. 2. Operation of Memory Controller

Figure 5:
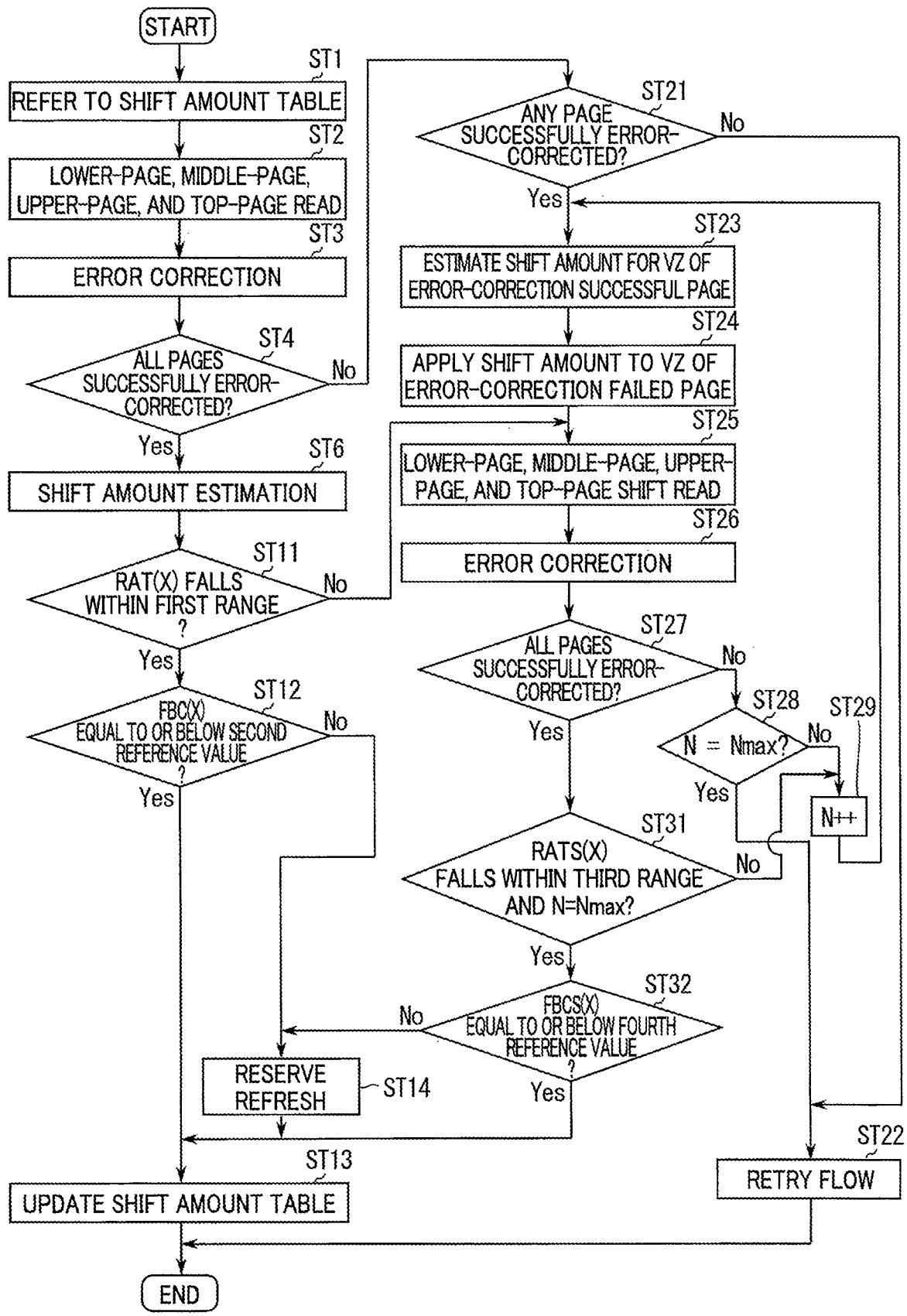
FIG. 5 shows an example flow of an operation of the memory controller, according to the first embodiment.

FIG. 5 shows an example flow of an operation of the memory controller 2 (in particular, the CPU 22), according to the first embodiment. The operation of FIG. 5 may be autonomously performed by the memory controller 2 to increase reliability of data while, for example, there are no uncompleted tasks instructed by the host device 3. Such a process will be hereinafter referred to as a "patrol process". FIG. 5 shows a flow of the patrol process on a lower page, a middle page, an upper page, and a top page of a cell unit (or, selected cell unit) CU. Some steps of the flow shown in FIG. 5 will be described later in detail.

At the start of the flow, the memory controller 2 sets a parameter N to "0".

In step ST1, the memory controller 2 refers to the shift amount table, and obtains the shift amounts OVA, $\Delta VB$, $\Delta VC$, $\Delta VD$, $\Delta VE$, $\Delta VF$, $\Delta VG$, $\Delta VH$, $\Delta VI$, $\Delta VJ$, $\Delta VK$, $\Delta VL$, $\Delta VM$, $\Delta VN$, and $\Delta VO$ regarding the selected cell unit CU. The shift amount $\Delta VX$ obtained in step ST1 may also be referred to as an "initial shift amount $\Delta VXi$".

In step ST2, the memory controller 2 reads data from the lower page, the middle page, the upper page, and the top page of the selected cell unit CU, while notifying the memory device 1 of the initial shift amount $\Delta VXi$. The read data is stored in the RAM 23. Hereinafter, data read from the lower page, the middle page, the upper page, and the top page are respectively referred to as "lower-page read data", "middle-page read data", "upper-page read data", and "top-page read data". When the lower-page read data, the middle-page read data, the upper-page read data, and the top-page read data do not need to be distinguished from each other, each of them will be referred to as "page read data", and the description about the page read data applies to all of the lower-page read data, the middle-page read data, the upper-page read data, and the top-page read data.

Alternatively, when the flow of FIG. 5 is performed as the first patrol process after a write operation to the selected cell unit CU, the memory controller 2 may read, in step ST2, data from the lower page, the middle page, the upper page, and the top page of the selected cell unit CU using, for example, a default read voltage VX, instead of using the initial shift amount $\Delta VXi$. That is, step ST1 is skipped in such a case.

In step ST3, the memory controller 2 attempts to correct errors in the lower-page read data, the middle-page read data, the upper-page read data, and the top-page read data, using the ECC circuit 26. The ECC circuit 26 generates data obtained by performing error correction on the lower-page read data, the middle-page read data, the upper-page read data, and the top-page read data, and further performs an error detection process on the generated data using, for example, a cyclic redundancy check (CRC). The data subjected to error correction and confirmed as containing no errors is stored in the RAM 23. Hereinafter, the data obtained by performing error correction on the lower-page read data, the middle-page read data, the upper-page read data, and the top-page read data and confirmed as containing no errors will be respectively referred to as "corrected lower-page read data", "corrected middle-page read data", "corrected upper-page read data", and "corrected top-page read data". Moreover, when the corrected lower-page read data, the corrected middle-page read data, the corrected upper-page read data, and the corrected top-page read data do not need to be distinguished from each other, each of them will be referred to as "corrected page read data", and the description about the corrected page read data applies to all of the corrected lower-page read data, the corrected middle-page read data, the corrected upper-page read data, and the corrected top-page read data. If error correction of the page read data fails, the data before the correction, namely, the page read data is handled as the corrected page read data.

There are both cases where an error correction succeeds and fails. The CPU 22 can recognize whether an error correction has succeeded or failed from, for example, a notification from the ECC circuit 26.

In step ST4, the memory controller 2 determines whether or not all of the lower-page read data, the middle-page read data, the upper-page read data, and the top-page read data have been successfully error-corrected. This determination can be performed by, for example, a notification from the ECC circuit 26. If none of the four types of the corrected page read data contain errors (Yes branch), the processing advances to step ST6.

In step ST6, the memory controller 2 estimates new shift amounts OVA, $\Delta$VB, $\Delta$VC, $\Delta$VD, $\Delta$VE, $\Delta$VF, $\Delta$VG, $\Delta$VH, $\Delta$VI, $\Delta$VJ, $\Delta$VK, $\Delta$VL, $\Delta$VM, $\Delta$VN, and $\Delta$VO. The estimation method will be described later. Hereinafter, the shift amount $\Delta$VX obtained in a step other than step ST1 of FIG. 5, such as step ST6, may also be referred to as an updated shift amount $\Delta$VXr. That is, updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr are respectively estimated for the read voltages VA, VB, VC, VD, VE, VF, VG, VH, VI, VJ, VK, VL, VM, VN, and VO.

As will be described later, the memory controller 2 calculates ratios RAT(A), RAT(B), RAT(C), RAT(D), RAT(E), RAT(F), RAT(G), RAT(H), RAT(I), RAT(J), RAT(K), RAT(L), RAT(M), RAT(N), and RAT(O), which are respectively for AR, BR, CR, DR, ER, FR, GR, HR, IR, JR, KR, LR, MR, NR, and OR, in the course of shift amount estimation. The ratio RAT(X) represents, for example, a ratio of the number of bits of a first type to the number of bits of a second type different from the first type.

Furthermore, the memory controller 2 calculates FBC(A), FBC(B), FBC(C), FBC(D), FBC(E), FBC(F), FBC(G), FBC(H), FBC(I), FBC(J), FBC(K), FBC(L), FBC(M), FBC(N), and FBC(O), which respectively represent values (numbers) for AR, BR, CR, DR, ER, FR, GR, HR, IR, JR, KR, LR, MR, NR, and OR, in the course of shift amount estimation. The value FBC(X) represents the number of bits determined in XR as having incorrect values.

In step ST11, the memory controller 2 determines whether or not all of the ratios RAT(A), RAT(B), RAT(C), RAT(D), RAT(E), RAT(F), RAT(G), RAT(H), RAT(I), RAT(J), RAT(K), RAT(L), RAT(M), RAT(N), and RAT(O) fall within a first range. It may be determined that one or more (excluding all) of the ratios RAT(A), RAT(B), RAT(C), RAT(D), RAT(E), RAT(F), RAT(G), RAT(H), RAT(I), RAT(J), RAT(K), RAT(L), RAT(M), RAT(N), and RAT(O) fall within the first range. An example of the first range will be described later. In the case of "Yes" in the determination in step ST11, the processing advances to step ST12.

In step ST12, the memory controller 2 determines whether or not all of the values FBC(A), FBC(B), FBC(C), FBC(D), FBC(E), FBC(F), FBC(G), FBC(H), FBC(I), FBC(J), FBC(K), FBC(L), FBC(M), FBC(N), and FBC(O) are equal to or below a second reference value. It may be determined that one or more (excluding all) of the values FBC(A), FBC(B), FBC(C), FBC(D), FBC(E), FBC(F), FBC(G), FBC(H), FBC(I), FBC(J), FBC(K), FBC(L), FBC(M), FBC(N), and FBC(O) are equal to or below a second reference value. The second reference value is set based on, for example, the correction capability and the specification of the ECC circuit 26. As an example, in the case of correcting errors in a frame of a particular size and the ECC circuit 26 is capable of correcting the number of error bits corresponding to, for example, 1/10 of the frame, the second reference value may be set to, for example, 1/10 of the number of correctable error bits, resulting in 1/100 of all the bits included in the frame. The second reference value specifies a target number of errors, which affects precision in shift amount estimation. Accordingly, the target value for the number of correctable error bits may be set in accordance with parameters with which the read performance is associated, such as the level of wear-out and the time elapsed from when the data is written (data retention time).

In the case of "Yes" in the determination in step ST12, the processing advances to step ST13. In step ST13, the memory controller 2 updates the values regarding the selected cell unit CU of the shift amount table with the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr. With the end of step ST13, the processing ends.

In the case of "No" in the determination in step ST12, the memory controller 2 reserves a refresh operation for the selected cell unit CU in step ST14. A refresh operation refers to writing the corrected form of the lower-page data, the middle-page data middle-page data, the upper-page data, and the top-page data into the selected cell unit CU. If the processing arrives at step ST14 from ST12, the corrected lower-page read data, the corrected middle-page read data, the corrected upper-page read data, and the corrected top-page read data are written. The reserved refresh operation may be performed, for example, after the end of the flow of FIG. 5. A refresh operation may be performed in step ST12. Step ST14 leads to step ST13.

In the case of "No" in the determination in step ST4, the processing advances to step ST21. In step ST21, the memory controller 2 determines whether at least one of the lower-page read data, the middle-page read data, the upper-page read data, and the top-page read data has been successfully error-corrected.

In the case of "No" in the determination in step ST21, the processing advances to step ST22. In step ST22, the memory controller 2 executes a retry flow. The retry flow includes any process for obtaining, from the selected cell unit CU, page read data that contains no errors, in accordance with an algorithm. With the end of step ST21, the processing ends.

In the case of "Yes" in the determination in step ST21, the processing advances to step ST23. In step ST23, the memory controller 2 estimates updated shift amounts ΔVZr for one or more read voltages VZ to be used in one or more read operations of one or more pages that have been successfully error-corrected at the start of step ST23, of the read voltages VA, VB, VC, VD, VE, VF, VG, VH, VI, VJ, VK, VL, VM, VN, and VO. The shift amount estimation in step ST23 is the same as the shift amount estimation in step ST6, except for the difference in the target for which the shift amount is estimated. For example, when the lower page has been successfully error-corrected, updated shift amounts ΔVAr, ΔVDr, ΔVFr, and ΔVKr are respectively estimated for the read voltages VA, VD, VF, and VK. Hereinafter, a page that has been successfully error-corrected at the start of step ST23 may be referred to as an "error-correction successful page", and a page for which the error correction has failed may be referred to as an "error-correction failed page". The same applies to the middle, upper, and top pages, and when a plurality of pages have been successfully error-corrected, updated shift amounts ΔVZr are estimated for a plurality of read voltages VZ to be used in read operations of all the error-correction successful pages. One or more updated shift amounts ΔVZr for one or more read voltages VZ to be used in a read operation of a page that has not been successfully error-corrected is not estimated in step ST23, and accordingly, such an updated shift amount ΔVZr is not obtained.

In step ST24, the memory controller 2 obtains one or more updated shift amounts ΔVZr to be used in a read operation of the error-correction failed page, using one or more updated shift amounts ΔVZr. The number of the updated shift amounts ΔVZr obtained in step ST24 is larger than the number of the updated shift amounts ΔVZr obtained in step ST23. Step ST24 will be described later.

Step ST24 and the No branch in step ST11 lead to step ST25. Step ST25 is similar to step ST2, and differs from step ST2 in difference in the shift amounts to be specified. That is, in step ST25, the memory controller 2 reads data (performs a shift read operation) from the lower page, the middle page, the upper page, and the top page of the selected cell unit CU, using the updated shift amount ΔVZr obtained at the start of step ST24. Hereinafter, the data read from the lower page, the middle page, the upper page, and the top page are respectively referred to as "lower-page shift read data", "middle-page shift read data", "upper-page shift read data", and "top-page shift read data". Moreover, when the lower-page shift read data, the middle-page shift read data, the upper-page shift read data, and the top-page shift read data do not need to be distinguished from each other, each of them will be referred to as "page shift read data", and the description about the page shift read data applies to all of the lower-page shift read data, the middle-page shift read data, the upper-page shift read data, and the top-page shift read data. The lower-page read data, the middle-page read data, the upper-page read data, and the top-page read data are respectively overwritten with, for example, the lower-page shift read data, the middle-page shift read data, the upper-page shift read data, and the top-page shift read data.

Step ST26 is similar to step ST3, and differs from step ST3 in terms of the error correction target. That is, in step ST26, the memory controller 2 detects errors in the lower-page shift read data, the middle-page shift read data, the upper-page shift read data, and the top-page shift read data, and attempts to correct errors, if any, using the ECC circuit 26. The ECC circuit 26 outputs data obtained by performing error correction on the lower-page shift read data, the middle-page shift read data, the upper-page shift read data, and the top-page shift read data and confirmed as containing no errors, and the output data is stored in the RAM 23. Hereinafter, the data obtained by performing error correction on the lower-page shift read data, the middle-page shift read data, the upper-page shift read data, and the top-page shift read data and confirmed as containing no errors will be respectively referred to as "corrected lower-page shift read data", "corrected middle-page shift read data", "corrected upper-page shift read data", and "corrected top-page shift read data". Moreover, when the corrected lower-page shift read data, the corrected middle-page shift read data, the corrected upper-page shift read data, and the corrected top-page shift read data do not need to be distinguished from each other, each of them will be referred to as "corrected page shift read data", and the description about the corrected page shift read data applies to all of the lower-page shift read data, the middle-page shift read data, the upper-page shift read data, and the top-page shift read data. If error correction of the page shift read data fails, the data before the error correction, namely, the page shift read data is handled as the corrected page shift read data. The corrected lower-page read data, the corrected middle-page read data, the corrected upper-page read data, and the corrected top-page read data are respectively overwritten with the corrected lower-page shift read data, the corrected middle-page shift read data, the corrected upper-page shift read data, and the corrected top-page shift read data.

Step ST27 is similar to step ST4, and differs from step ST4 in terms of the determination target. In step ST27, the memory controller 2 determines whether or not all of the lower-page shift read data, the middle-page shift read data, the upper-page shift read data, and the top-page shift read data have been successfully error-corrected. In the case of "No" in the determination in step ST27, the processing advances to step ST28.

In step ST28, the memory controller 2 determines whether or not the parameter N is equal to the upper limit Nmax. In the case of "Yes" in the determination in step ST28, the processing advances to step ST22. In the case of "No" in the determination in step ST28, the memory controller 2 increments the parameter N by one in step ST29. Step ST29 leads to step ST23.

In the case of "Yes" in the determination in step ST27, the processing advances to step ST31. In step ST31, the memory controller 2 calculates ratios RATS(A), RATS(B), RATS(C), RATS(D), RATS(E), RATS(F), RATS(G), RATS(H), RATS(I), RATS(J), RATS(K), RATS(L), RATS(M), RATS(N), and RATS(O), which are respectively for AR, BR, CR, DR, ER, FR, GR, HR, IR, JR, KR, LR, MR, NR, and OR. The ratio RATS(X) represents, for example, a ratio of the number of bits of a first type to the number of bits of a second type different from the first type.

Next, the memory controller 2 determines whether or not both an upper-limit condition and a range condition are satisfied. The upper-limit condition is that the parameter N is Nmax. The range condition is that all of the ratios RATS(A), RATS(B), RATS(C), RATS(D), RATS(E), RATS(F), RATS(G), RATS(H), RATS(I), RATS(J), RATS(K), RATS(L), RATS(M), RATS(N), and RATS(O) fall within a third range. The third range may be either different from or the same as the first range. The range condition may be that one or more (excluding all) of the ratios RATS(A), RATS(B), RATS(C), RATS(D), RATS(E), RATS(F), RATS(G), RATS(H), RATS(I), RATS(J), RATS(K), RATS(L), RATS(M), RATS(N), and RATS(O) fall within the third range.

In the case of "No" in the determination in step ST31, the processing advances to step ST29. In the case of "Yes" in the determination in step ST31, the processing advances to step ST32.

In step ST32, the memory controller 2 calculates FBCS (A), FBCS(B), FBCS(C), FBCS(D), FBCS(E), FBCS(F), FBCS(G), FBCS(H), FBCS(I), FBCS(J), FBCS(K), FBCS (L), FBCS(M), FBCS(N), and FBCS(O), which respectively represent values (numbers) for AR, BR, CR, DR, ER, FR, GR, HR, IR, JR, KR, LR, MR, NR, and OR. The value FBCS(X) represents the number of bits determined, in XR using the updated shift amounts $\Delta$VZr, as having incorrect values.

Subsequently, the memory controller 2 determines whether or not all of the values FBCS(A), FBCS(B), FBCS (C), FBCS(D), FBCS(E), FBCS(F), FBCS(G), FBCS(H), FBCS(I), FBCS(J), FBCS(K), FBCS(L), FBCS(M), FBCS (N), and FBCS(O) are equal to or below a fourth reference value. It may be determined that one or more (excluding all) of the values FBCS(A), FBCS(B), FBCS(C), FBCS(D), FBCS(E), FBCS(F), FBCS(G), FBCS(H), FBCS(I), FBCS (J), FBCS(K), FBCS(L), FBCS(M), FBCS(N), and FBCS (O) are equal to or below a fourth reference value. The fourth reference value may be either different from or the same as the second reference value.

In the case of "No" in the determination in step ST32, the processing advances to step ST14. In the case of "Yes" in the determination in step ST32, the processing advances to step ST13.

1. 2. 2. 1. Shift Amount Estimation (Step ST6)

The shift amount estimation in step ST6 will be described in more detail below, with reference to FIGS. 6-9.

Figure 6:
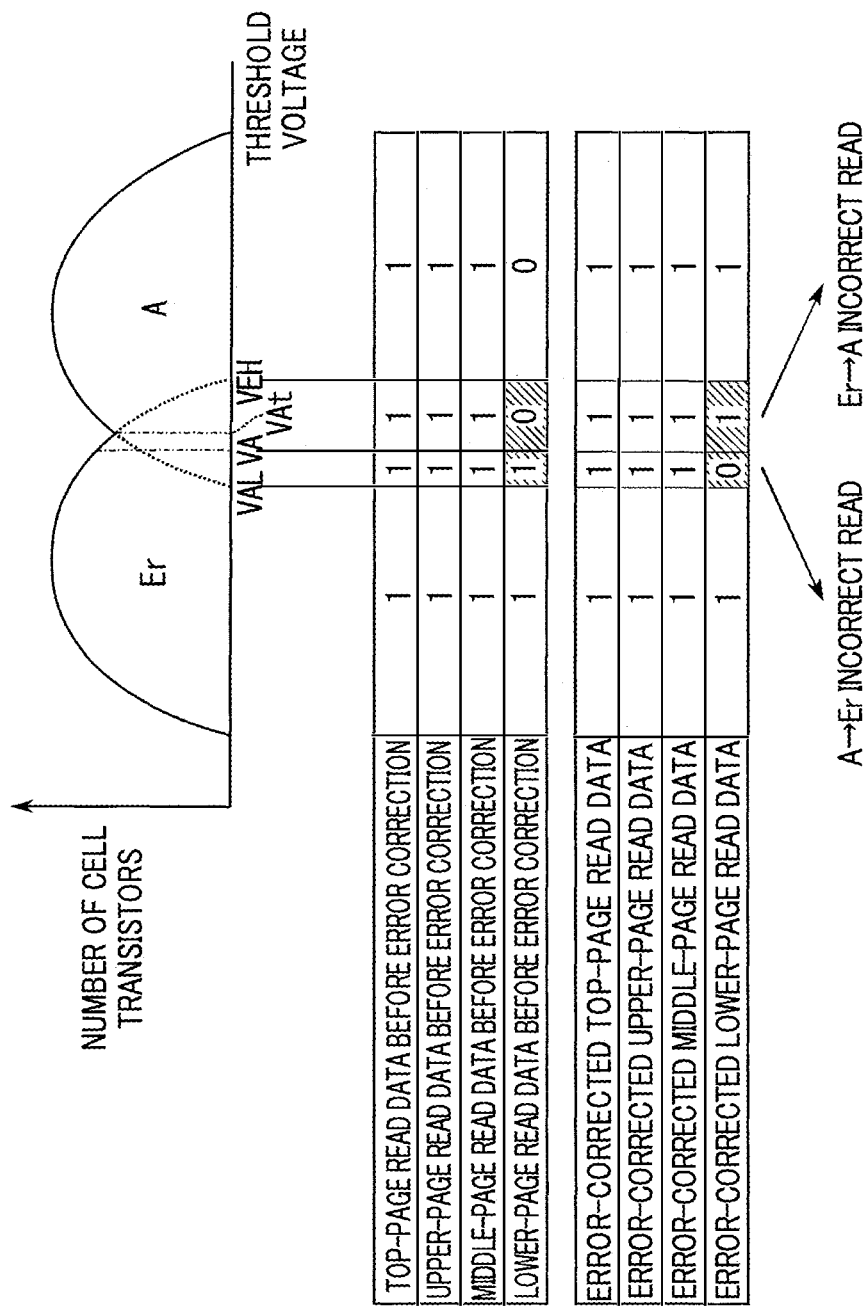
FIG. 6 shows an example of states of memory cells to which data has been written, and items of data before and after error correction, according to the first embodiment.

FIG. 6 shows an example of states of memory cells MC of the memory device 1 to which data has been written, and items of data before and after error correction, according to the first embodiment. Specifically, FIG. 6 shows distributions of threshold voltages of memory cell transistors MT after a period of time has elapsed since 4-page data is written into a cell unit CU. FIG. 6 also shows error-containing data read from a memory cell brought from Er state to A state through a write operation using a read voltage VA, and error-corrected (correct) data.

As shown in FIG. 6, the threshold voltages of the memory cell transistors MT may undergo an unintended change over time. Accordingly, some of the memory cell transistors MT brought to A state have threshold voltages lower than the read voltage VA, and may be incorrectly determined, in AR using the read voltage VA, as being in Er state (denoted by the hatching). Similarly, some of the memory cell transistors MT brought to Er state through a write operation have threshold voltages higher than the read voltage VA, and may be incorrectly determined, in AR using the read voltage VA, as being in A state.

Of the threshold voltages of the memory cell transistors MT brought to A state through a write operation, the lowest one will be referred to as a voltage VAL. Of the threshold voltages of the memory cell transistors MT brought to Er state through a write operation, the highest one will be referred to as a voltage VEH. However, the memory controller 2 does not recognize which of the memory cell transistors MT brought to A state has a threshold voltage lower than the read voltage VA. Similarly, the memory controller 2 does not recognize which of the memory cell transistors MT brought to Er state has a threshold voltage higher than the read voltage VA. Accordingly, the dotted portions of the threshold distribution curves in FIG. 6 are unknown, and are merely plotted for convenience in explanation.

A memory cell transistor MT brought to A state through a write operation and having a threshold voltage lower than the read voltage VA is determined as storing "1" in a corresponding bit in the lower page. However, this bit is corrected to have "0" by the error correction (denoted by the hatching). It follows that the memory cell transistor MT has been brought to A state, but is incorrectly determined as being in Er state. Such an incorrect read operation will be referred to as an "A→Er incorrect read operation". The bit at the position where the A→Er incorrect read operation has occurred will be referred to as an "A→Er error bit". To identify the A→Er error bit, the memory controller 2 compares the values of the bits at the same position in the lower-page, middle-page, upper-page, and top-page read data (before the error correction), and those in the error-corrected lower-page, middle-page, upper-page, and top-page read data. If the bits at the same position in the lower-page, middle-page, upper-page, and top-page read data and the error-corrected middle-page, upper-page, and top-page read data have "1", and the bit at the same position in the error-corrected lower-page read data has "0", the bit at that position can be identified as the A→Er error bit. The memory controller 2 identifies all the A→Er error bits from all the bits included in a page, and counts the number C(A→Er) of the identified A→Er error bits.

Similarly, a memory cell transistor MT brought to Er state through a write operation and having a threshold voltage higher than the read voltage VA is determined as storing "0" in a corresponding bit in the lower page. However, the bit is corrected to have "1" by the error correction (shown by the hatching). It follows that the memory cell transistor MT has been brought to Er state, but is incorrectly determined as being in A state. Such an incorrect read operation will be referred to as "Er→A incorrect read operation". The bit at the position where the Er→A incorrect read operation has occurred will be referred to as an "Er→A error bit". To identify the Er→A error bit, the memory controller 2 compares the values of the bits at the same position in the lower-page, middle-page, upper-page, and top-page read data (before the error correction), and those in the error-corrected lower-page, middle-page, upper-page, and top-page read data. If the bits at the same position in the middle-page, upper-page, and top-page read data and the error-corrected lower-page, middle-page, upper-page, and top-page read data have "1", and the bit at the same position in the lower-page read data have "0", the bit at that position can be identified as the Er→A error bit. The memory controller 2 identifies all the Er→A error bits from all the bits included in a page, and counts the number C(Er→A) of the identified Er→A error bits.

The sum of the number C(A→Er) and the number of the C(Er→A) is equal to the value FBC(A) described in relation to step ST6 with reference to FIG. 5.

The Er→A incorrect read operation and the A→Er incorrect read operation are caused by a difference between the read voltage VA and the read voltage VAt, which is equal to the threshold voltage at the valley of the threshold voltage distribution curves. Assuming that the threshold voltage distribution of the memory cell transistors MT in Er state and the threshold voltage distribution of the memory cell transistors MT in A state are symmetrical, as shown by the portion (a) of FIG. 7, the number of the A→Er error bits and the number of the Er→A error bits reach their minimum when a read voltage VAt of a magnitude equal to the threshold voltage at the position of the valley of the threshold voltage distribution curves is used. At this time, the number of the A→Er error bits and the number of the Er→A error bits are equal.

As shown by the portion (b) of FIG. 7, when a read voltage VA1 lower than the optimum read voltage VAt is used, the number of the A→Er error bits is smaller than the number of the Er→A error bits. The difference between the number of the A→Er error bits and the number of the Er→A error bits increases as the read voltage VA1 decreases, as compared to the optimum read voltage VAt.

As shown by the portion (c) of FIG. 7, when a read voltage VA2 higher than the optimum read voltage VAt is used, the number of the A→Er error bits is larger than the number of the Er→A error bits. The difference between the number of the A→Er error bits and the number of the Er→A error bits increases as the read voltage VA2 increases, as compared to the optimum read voltage VAt.

Accordingly, it is desirable, in a read operation from the selected cell unit CU, to use the read voltage VAt and to estimate the read voltage VAt. As described above, the difference between a read voltage VA and the optimum read voltage VAt depends on the number of the A→Er error bits and the number of the Er→A error bits in AR in which the read voltage VA is used. Accordingly, it is possible to estimate the optimum read voltage VAt from the number of A→Er error bits and the number of Er→A error bits when the read voltage VA is used. For estimation, the memory controller 2 calculates a ratio RAT(A) described in relation to step ST6 with reference to FIG. 5. The ratio RAT(A) may be, for example, C(Er→A)/C(A→Er). The ratio RAT(A) has a correlation with the shift amount ΔVA for obtaining the read voltage VAt, and the memory controller 2 is capable of determining the shift amount ΔVA based on the ratio RAT(A). The determination method will be described below.

Figure 8:
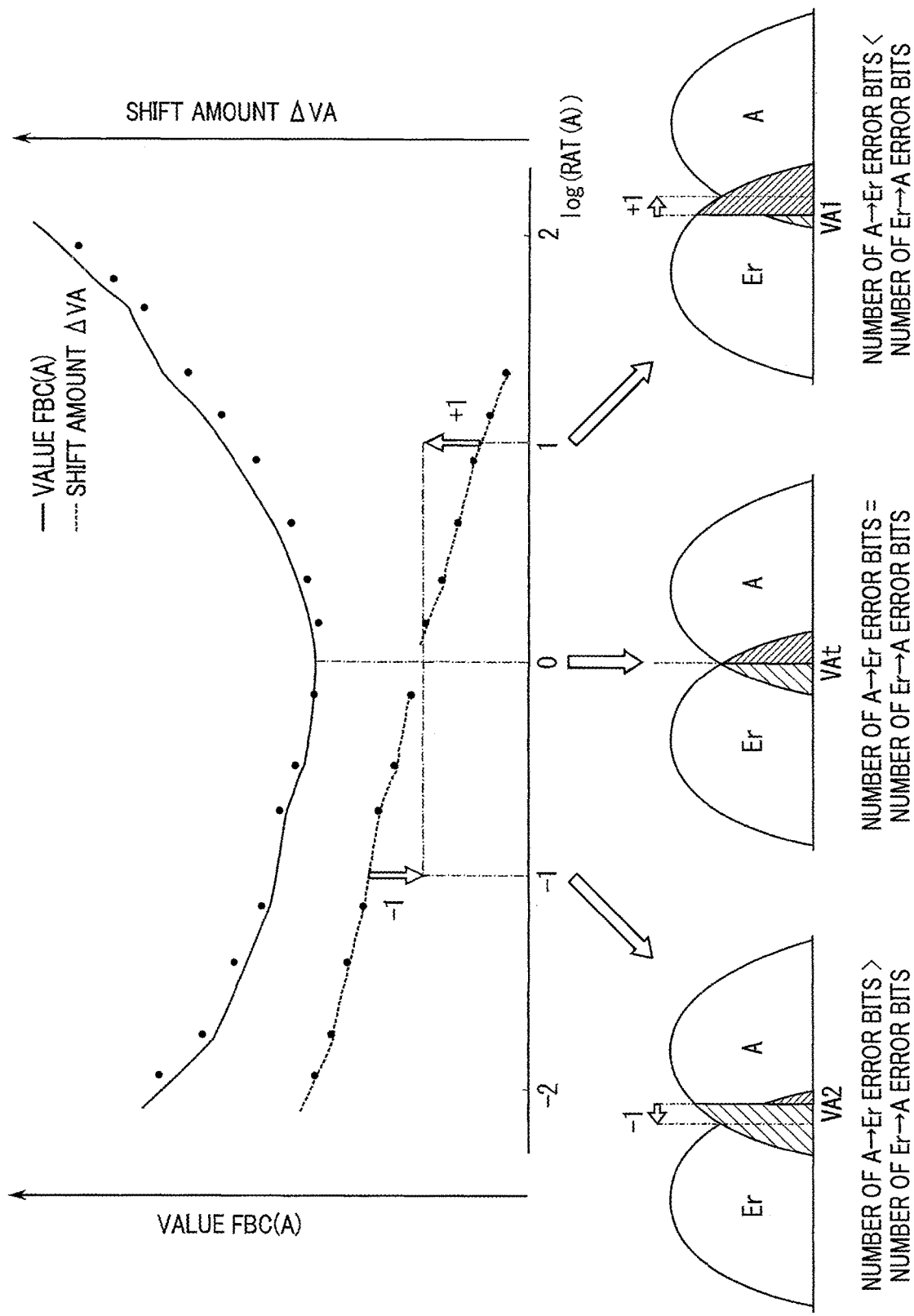
FIG. 8 shows an example of a relationship between a ratio and a value and examples of a relationship between the ratio and an updated shift amount for a selected cell unit according to the first embodiment.

FIG. 8 shows, on a logarithmic scale, a relationship between a ratio RAT(A) and a value FBC(A), and a relationship between the ratio RAT(A) and a shift amount ΔVAt estimated to be optimum, regarding a selected cell unit CU in a memory device according to the first embodiment. The shift amount ΔVAt estimated to be optimum (hereinafter also simply referred to as "estimated shift amount") denotes a difference between the optimum read voltage VAt and a reference read voltage VA.

As shown in FIG. 8, the ratio RAT(A) has a correlation with the value FBC(A), and the value FBC(A) reaches its minimum when the ratio RAT(A)=1 (or, log(RAT(A))=1). Accordingly, the read voltage that causes the ratio RAT(A)=1 is the optimum read voltage VAt, which is equal to the threshold voltage at the position of the valley of the threshold voltage distribution curves.

The ratio RAT(A) also has a correlation with the shift amount OVA, and the read voltage VA2 which has caused the ratio RAT(A) increases as the absolute value of the negative log(RAT(A)) increases. On the other hand, the read voltage VA1 which has caused the ratio RAT(A) increases as the absolute value of the positive log (RAT(A)) increases.

Based on this correlation, the memory controller 2 obtains, by estimation, an estimated shift amount ΔVAt from the ratio RAT(A) obtained using a read voltage VA. In the example of FIG. 8, the estimated shift amount ΔVAt is −1 (e.g., −3DAC) if log(RAT(A))=−1. The estimated shift amount ΔVAt is +1 (e.g., +3DAC) if log(RAT(A))=1.

The memory controller 2 is capable of functionally determining an estimated shift amount ΔVAt for a ratio RAT(A). Alternatively, the memory controller 2 is capable of determining the estimated shift amount ΔVAt for a ratio RAT(A) based on a predetermined correspondence. To achieve this, the memory controller 2 stores a set of items of data associated with each other, as in the table shown in FIG. 9, on the RAM 23 for the duration of, for example, power supply. FIG. 9 shows an example of correspondence between ratios and shift amounts, according to the first embodiment. Ranges of values of different ratios RAT are defined, as shown in FIG. 9. The ranges do not overlap with one another. The ranges are respectively associated with estimated shift amounts ΔVXt. The table of correspondence between the ratios and the shift amounts may be prepared exclusively for each XR, or may be shared among one or more or all of ZR.

The estimated shift amount ΔVAt thus obtained is used as the updated shift amount ΔVAr.

Also, the memory controller 2 calculates, by estimation, estimated shift amounts ΔVBt, ΔVCt, ΔVDt, ΔVEt, ΔVFt, ΔVGt, ΔVHt, ΔVIt, ΔVJt, ΔVKt, ΔVLt, ΔVMt, ΔVNt, and ΔVOt. The estimated shift amount ΔVXt represents a difference from a reference read voltage VX. A method of calculating estimated shift amounts ΔVBt, ΔVCt, ΔVDt, ΔVEt, ΔVFt, ΔVGt, ΔVHt, ΔVIt, ΔVJt, ΔVKt, ΔVLt, ΔVMt, ΔVNt, and ΔVOt is similar to the method of calculating the estimated shift amount ΔVAt. That is, to calculate an estimated shift amount ΔVXt for a read voltage VX, a memory cell transistor MT determined as being in either of the two states (i.e., a higher-voltage state and a lower-voltage state) distinguished by a read voltage VX is focused on. The higher-voltage state distinguished by the read voltage VX is a state to which memory cell transistors MT determined as having a threshold voltage equal to or greater than the read voltage VX belong. The lower-voltage state distinguished by the read voltage VX is a state to which memory cell transistors MT determined as having a threshold voltage smaller than the read voltage VX belong. For example, in the case of two states distinguished by a read voltage VC, the lower-voltage state is B state, and the higher-voltage state is C state.

In a manner similar to the counting of the number of the A→Er error bits, the memory controller 2 calculates, based on the bits in the lower-page, middle-page, upper-page, and top-page read data, a first number of error bits of memory cell transistors MT having been determined as being in the lower-voltage state, but determined, by an error correction, as being in the higher-voltage state. The first number of error bits corresponds to the number C(A→Er) in the case of calculating the estimated shift amount ΔVAt by estimation.

In a manner similar to the counting of the number of the Er→A error bits, the memory controller 2 calculates, based on the values of bits in the lower-page, middle-page, upper-page, and top-page read data, a second number of error bits of memory cell transistors MT having been determined as being in the higher-voltage state, but determined, by an error correction, as being in the lower-voltage state. The second number of error bits corresponds to the number C(Er→A) in the case of calculating the estimated shift amount ΔVAt by estimation.

In a manner similar to the calculation of the ratio RAT(A), the memory controller 2 calculates the ratio RAT(Z), which is the second number of error bits divided by the first number of error bits. The memory controller 2 determines an estimated shift amount ΔZt based on the ratio RAT(Z), in a manner similar to the determination of the estimated shift amount ΔVAt based on the ratio RAT(A).

Also, the memory controller 2 respectively uses the estimated shift amounts ΔVBt, ΔVCt, ΔVDt, ΔVEt, ΔVFt, ΔVGt, ΔVHt, ΔVIt, ΔVJt, ΔVKt, ΔVLt, ΔVMt, ΔVNt, and ΔVOt as updated shift amounts ΔVBr, ΔVCr, ΔVDr, ΔVEr, ΔVFr, ΔVGr, ΔVHr, ΔVIr, ΔVJr, ΔVKr, ΔVLr, ΔVMr, ΔVNr, and ΔVOr.

In the case of using the ratio RAT(X) described above, the first range used in step ST11 may be greater than 0.5 and equal to or below 2.

1. 2. 2. 2. Shift Amount Estimation and Shift Amount Application (Steps ST23 and ST24)

As described with reference to FIG. 5, a set of steps ST23, ST24, ST25, ST26, and ST27 is repeated within a range of not exceeding the upper limit, until all the four items of page shift read data of the selected cell unit CU are successfully error-corrected.

The processing of steps ST23 and ST24 in one loop will be described in more detail below, with reference to FIGS. 10 to 14.

At the start of step ST23, only one to three error-correction successful pages are obtained, of four pages in total in the selected cell unit CU. If the processing arrives at step ST23 from step ST21, one, two, or three of the corrected lower-page, middle-page, upper-page, and top-page read data obtained in step ST3 have been successfully error-corrected, and is subjected to shift amount estimation in step ST23.

On the other hand, if the processing arrives at step ST23 from step ST29, one, two, or three of the corrected lower-page, middle-page, upper-page, and top-page shift read data obtained in step ST26 has/have been successfully error-corrected, and is/are subjected to shift amount estimation in step ST23.

FIGS. 10 to 14 show examples of results of the shift amount estimation in step ST23 and a shift read operation in step ST25 in different loops. FIGS. 10, 11, 13 and 14 show states in different loops, where the steps ST23, ST24, ST25, ST26, ST27, ST28, and ST29 shown in FIG. 5 form one loop. FIGS. 10, 11, 13 and 14 respectively show states in a first loop, a second loop, a third loop, and a fourth loop. The solid line represents threshold voltage distributions of memory cell transistors MT of a selected cell unit CU in step ST23. The dashed line represents threshold voltage distributions of memory cell transistors MT of the selected cell unit CU immediately after data is written.

In the notation "#1:#2" (where #1 and #2 are numerical values) shown below "VA", "VB", "VC", "VD", "VE", "VF", "VG", "VH", "VI", "VJ", "VK", "VL", "VM", "VN", and "VO" in FIGS. 10 to 14, "#1" and "#2" represent the number of bits determined as belonging to a state different from the state to which the selected cell unit CU has been brought, among the bits in the selected cell unit CU. More specifically, the numerical value #1 indicates the first number of error bits, namely, the number of bits that have been brought to the higher-voltage state but determined as being in the lower-voltage state, of the two states (i.e., the higher-voltage state and the lower-voltage state) determined based on the read voltage VX as to which state each bit belongs to. The numerical value #2 indicates the second number of error bits, namely, the number of bits that have been brought to the lower-voltage state but determined as being in the higher-voltage state. That is, #2/#1=RAT(X).

The notation "#1:#2" in parentheses indicate values of read voltages VX for pages that have not been successfully error-corrected, which are shown to facilitate understanding, even though such values are actually unknown to the memory controller 2. The numerical values at the right of the page-specifying notations such as "lower page", "middle page", "upper page" and "top page" in FIGS. 10-14 represent the total FBC in data in the corresponding page. The total FBC is equal to the sum of all the numbers corresponding to "#1" and all the numbers corresponding to "#2" in all the occurrences of "#1:#2" in the corresponding page. Each of the arrows shown in FIGS. 10 to 14 represents a vector, with its direction showing a sign (either positive or negative) of the updated shift amount ΔVXr that has been calculated or applied, and its length showing a magnitude of the updated shift amount ΔVXr.

Figure 10:
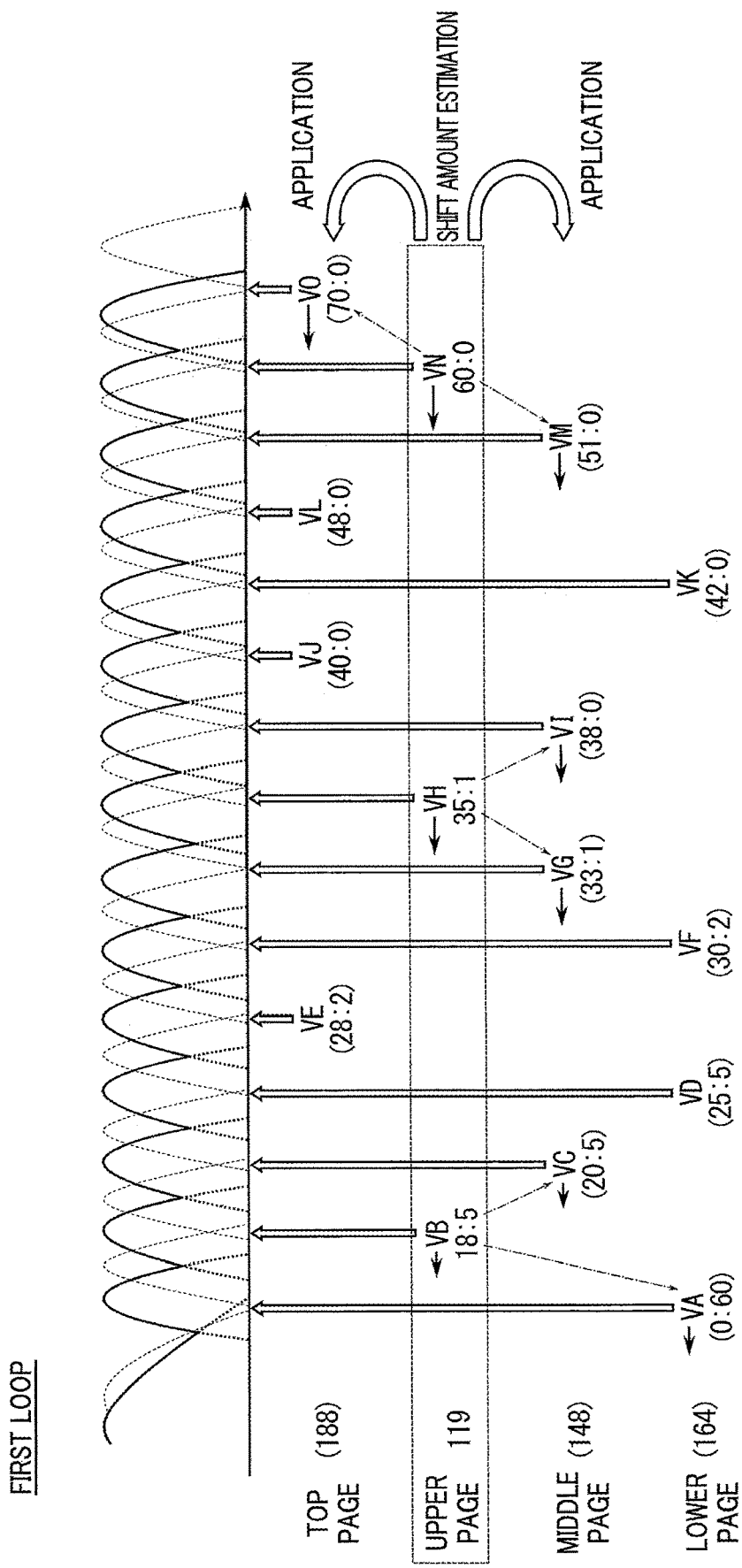
FIG. 10 shows an example of a result of shift amount estimation and a shift read operation in a processing loop in the memory controller according to the first embodiment.

FIG. 10 shows an example in which only the upper-page read data (i.e., step ST21 is taken) or the upper-page shift read data (i.e., step ST29 is taken) have been successfully error-corrected. That is, in step ST23 of the first loop, read voltages for the upper page are subjected to shift amount estimation. In step ST23 of the first loop, updated shift amounts ΔVBr, ΔVHr, and ΔVNr are determined.

In step ST24 of the first loop, the updated shift amount ΔVBr is applied as updated shift amounts ΔVAr and ΔVCr, the updated shift amount ΔVHr is applied as updated shift amounts ΔVGr and ΔVIr, and the updated shift amount ΔVNr is applied as updated shift amounts ΔVMr and ΔVOr. The relationship of an application of an updated shift amount is shown by a dash-dotted line in the drawings. In steps ST23 and ST24 of the first loop, updated shift amounts ΔVAr, ΔVBr, ΔVCr, ΔVGr, ΔVHr, ΔVIr, ΔVMr, ΔVNr, and ΔVOr are obtained.

In step ST25 of the first loop, the updated shift amounts ΔVAr, ΔVBr, ΔVCr, ΔVGr, ΔVHr, ΔVIr, ΔVMr, ΔVNr, and ΔVOr obtained in steps ST23 and ST24 of the first loop are used. In the example of FIG. 10, the middle-page shift read data and the top-page shift read data are successfully error-corrected, in addition to the upper-page shift read data, in step ST26 of the first loop. Accordingly, the corrected middle-page read data is updated with the corrected middle-page shift read data, and the corrected top-page read data is updated with the corrected top-page shift read data. Since the corrected upper-page read data is the same as the corrected upper-page shift read data, the corrected upper-page read data may be either updated or not updated with the corrected upper-page shift read data. In the example of FIG. 10, all four items of shift read data have not been successfully error-corrected, and accordingly, the processing enters the second loop.

Figure 11:
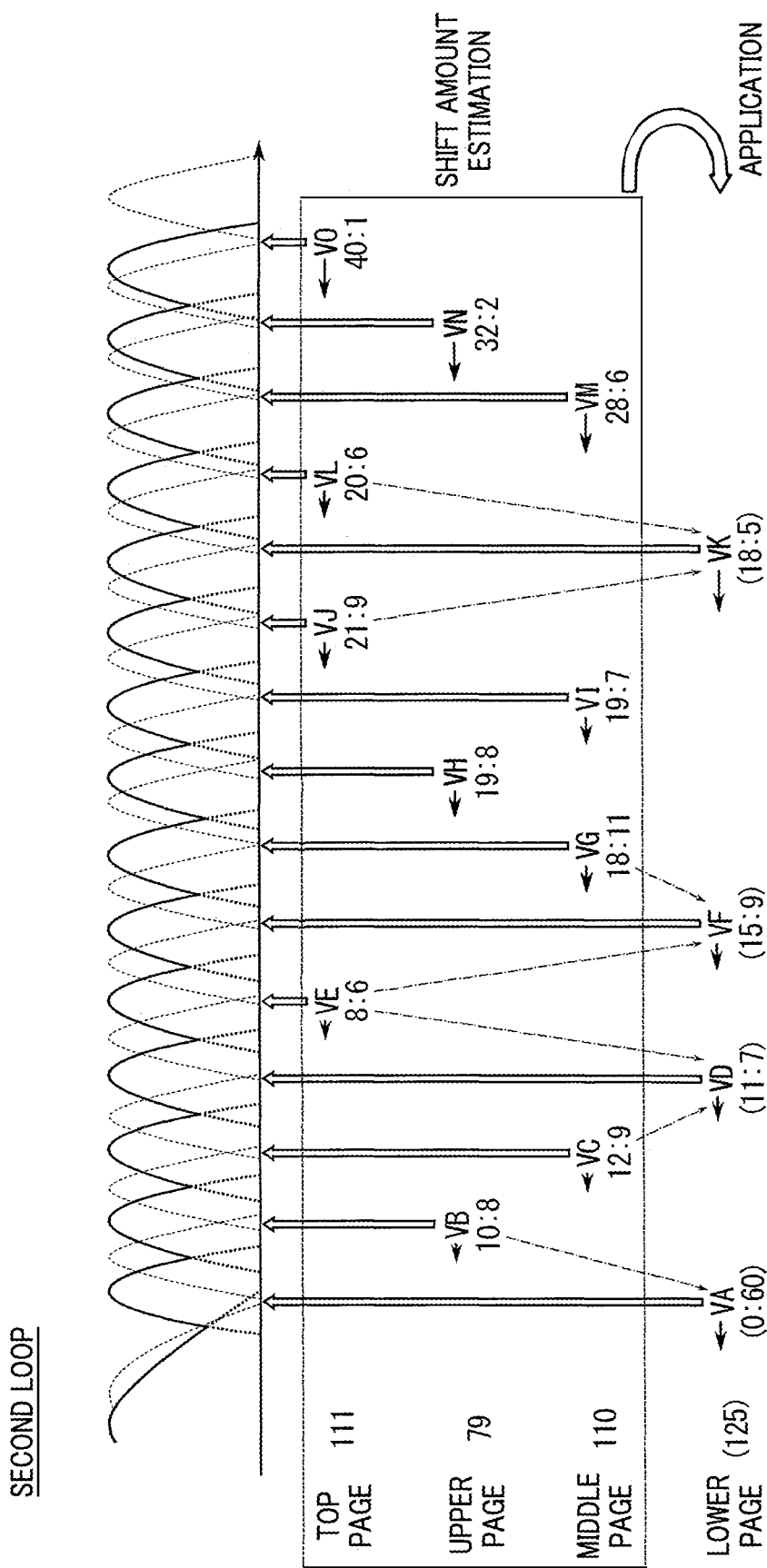
FIG. 11 shows an example of a result of shift amount estimation and a shift read operation in a loop subsequent to the loop of FIG. 10, in the memory controller according to the first embodiment.

Since the middle-page shift read data and the top-page shift read data have been successfully error-corrected in the first loop, read voltages for the middle page, the upper page, and the top page are subjected to shift amount estimation in step ST23 of the second loop shown in FIG. 11. In step ST23 of the second loop, updated shift amounts ΔVBr, ΔVCr, ΔVEr, ΔVGr, ΔVHr, ΔVIr, ΔVJr, ΔVLr, ΔVMr, ΔVNr, and ΔVOr are determined.

In step ST24 of the second loop, the updated shift amount ΔVBr is applied as an updated shift amount ΔVAr, the updated shift amounts ΔVCr and/or ΔVEr are applied as an updated shift amount ΔVDr, the updated shift amounts ΔVEr and/or ΔVGr are applied as an updated shift amount ΔVFr, and the updated shift amounts ΔVJr and/or ΔVLr are applied as an updated shift amount ΔVKr. As a result of steps ST23 and ST24 of the second loop, the updated shift amounts ΔVAr, ΔVBr, ΔVCr, ΔVDr, ΔVEr, ΔVFr, ΔVGr, ΔVHr, ΔVIr, ΔVJr, ΔVKr, ΔVLr, ΔVMr, ΔVNr, and ΔVOr are obtained.

When two updated shift amounts in total are available for read voltages adjacent to one read voltage to which the updated shift amount is applied, any selected one of the two may be used, or a mean of the two values may be used. FIG.

12 shows an example of applications of updated shift amounts to a read voltage VF in the memory controller according to the first embodiment.

As shown in FIG. 12, an updated shift amount $\Delta$VFr is not determined in step ST23 (denoted by the symbol "x"). On the other hand, the updated shift amounts $\Delta$VEr and $\Delta$VGr, which are respectively for read voltages VE(ER) and VG(GR) that are adjacent to the read voltage VF(FR), are respectively determined in step ST23 as −1 and −5. In this case, the updated shift amount $\Delta$VEr (=−1) or the updated shift amount $\Delta$VGr (=−5) may be applied to the updated shift amount $\Delta$VFr, or a mean (=−3) of the updated shift amounts $\Delta$VEr and $\Delta$VGr may be applied thereto. FIG. 12 shows an example in which a mean is applied.

Referring back to FIG. 11, the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr obtained in steps ST23 and ST24 of the second loop are used in step ST25 of the second loop. Through use of the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr, some ratios RAT(Z) come close to 1, and some numbers FBC(Z) become lower than the corresponding numbers FBC(Z) in the first loop. On the other hand, in the example of FIG. 11, even through use of the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr in step ST26 of the second loop, the lower-page shift read data is not successfully error-corrected. Accordingly, the processing enters the third loop.

Figure 13:
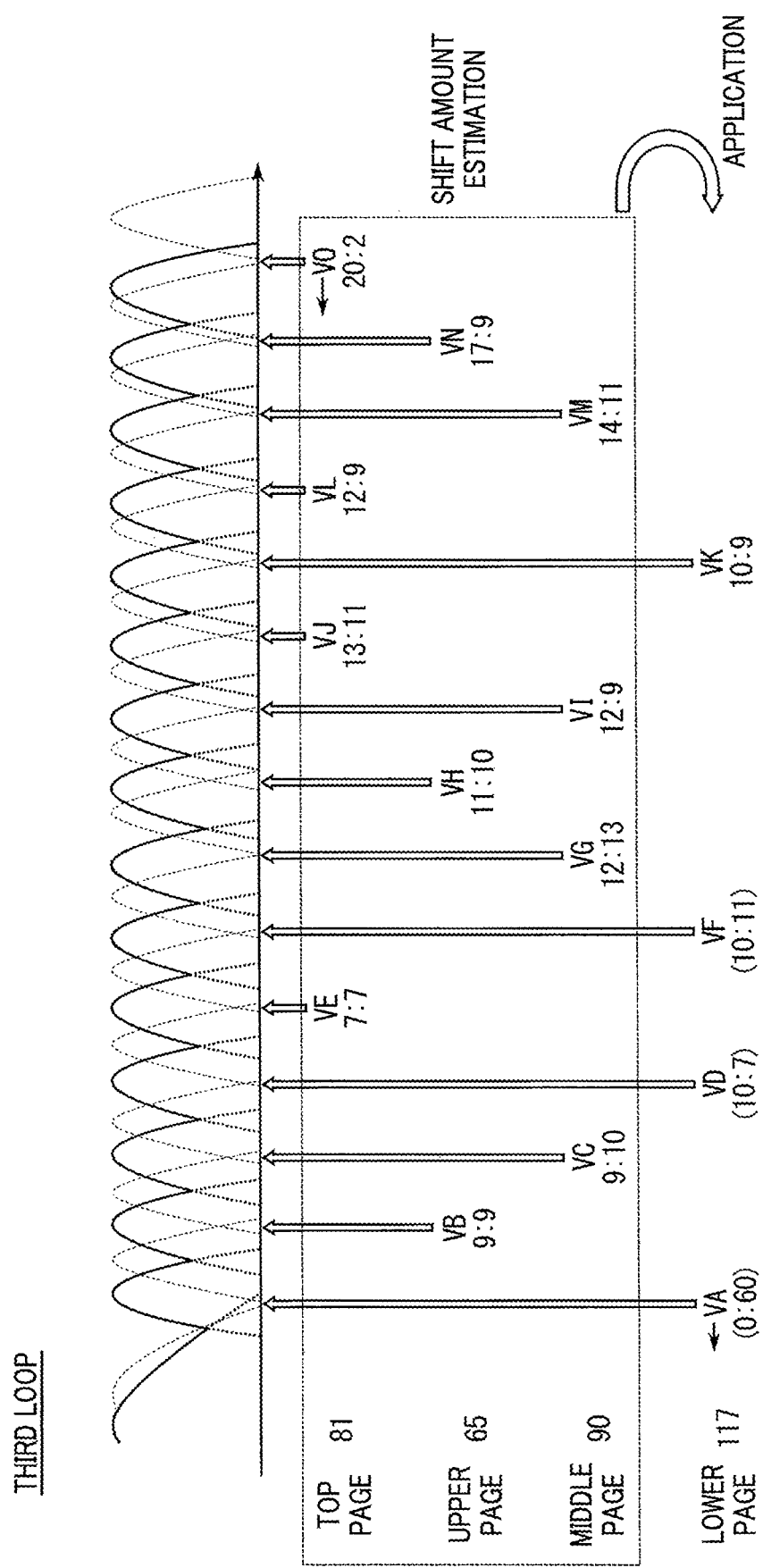
FIG. 13 shows an example of a result of shift amount estimation and a shift read operation in a loop subsequent to the loop in FIG. 11, in the memory controller according to the first embodiment.

Since error correction has failed on the lower-page shift read data in the second loop, the read voltages for the middle page, the upper page, and the top page are subjected to shift amount estimation in step ST23 of the third loop shown in FIG. 13, as in the second loop. In the course of step ST23 of the third loop, the ratios RAT(Z) for some read voltages VZ have come to fall within the third range. Updated shift amounts $\Delta$VZr for such read voltages VZ are not estimated in step ST23. In the example of FIG. 13, the ratios RAT(B), RAT(C), RAT(D), RAT(E), RAT(F), RAT(G), RAT(H), RAT(I), RAT(J), RAT(K), RAT(L), RAT(M), and RAT(N) fall within the third range, as a result of the shift read operations in step ST25 of the second loop. Accordingly, the updated shift amounts $\Delta$VBr, $\Delta$VCr, $\Delta$VEr, $\Delta$VGr, $\Delta$VHr, $\Delta$VIr, $\Delta$VJr, $\Delta$VKr, $\Delta$VLr, $\Delta$VMr, and $\Delta$VNr are not determined, and the updated shift amounts $\Delta$VAr, $\Delta$VDr, $\Delta$VFr, and $\Delta$VKr for the lower page, which is not subjected to shift amount estimation, are not determined. Instead, the updated shift amounts $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, and $\Delta$VNr estimated in the last loop (i.e., second loop) are maintained as the fixed final values, and are not estimated again until the end of the flow of FIG. 5. On the other hand, of BR, CR, ER, GR, HR, IR, JR, LR, MR, NR, and OR for the three pages subjected to shift amount estimation, namely, the middle page, the upper page, and the top page, the ratio RAT(O) for OR falls outside the third range. Accordingly, the updated shift amount $\Delta$VOr is determined.

In step ST24 of the third loop, an adjacent updated shift amount $\Delta$VBr is applied to an updated shift amount $\Delta$VAr, which is not subjected to shift amount estimation in step ST23 and which has not yet been fixed. In this manner, in steps ST23 and ST24 of the third loop, the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr are obtained.

In step ST25 of the third loop, the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr obtained in steps ST23 and ST24 of the third loop are used. Through use of the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr, some ratios RAT(Z) come close to 1, and values FBC(Z) become lower than the corresponding numbers FBC(Z) in the second loop. In the example of FIG. 13, all the four items of shift read data are successfully error-corrected in step ST26 of the third loop. However, since the parameter (loop number) N is less than Nmax, and one or more RAT(Z) that do not fall within the third range are present, the processing enters the fourth loop.

Figure 14:
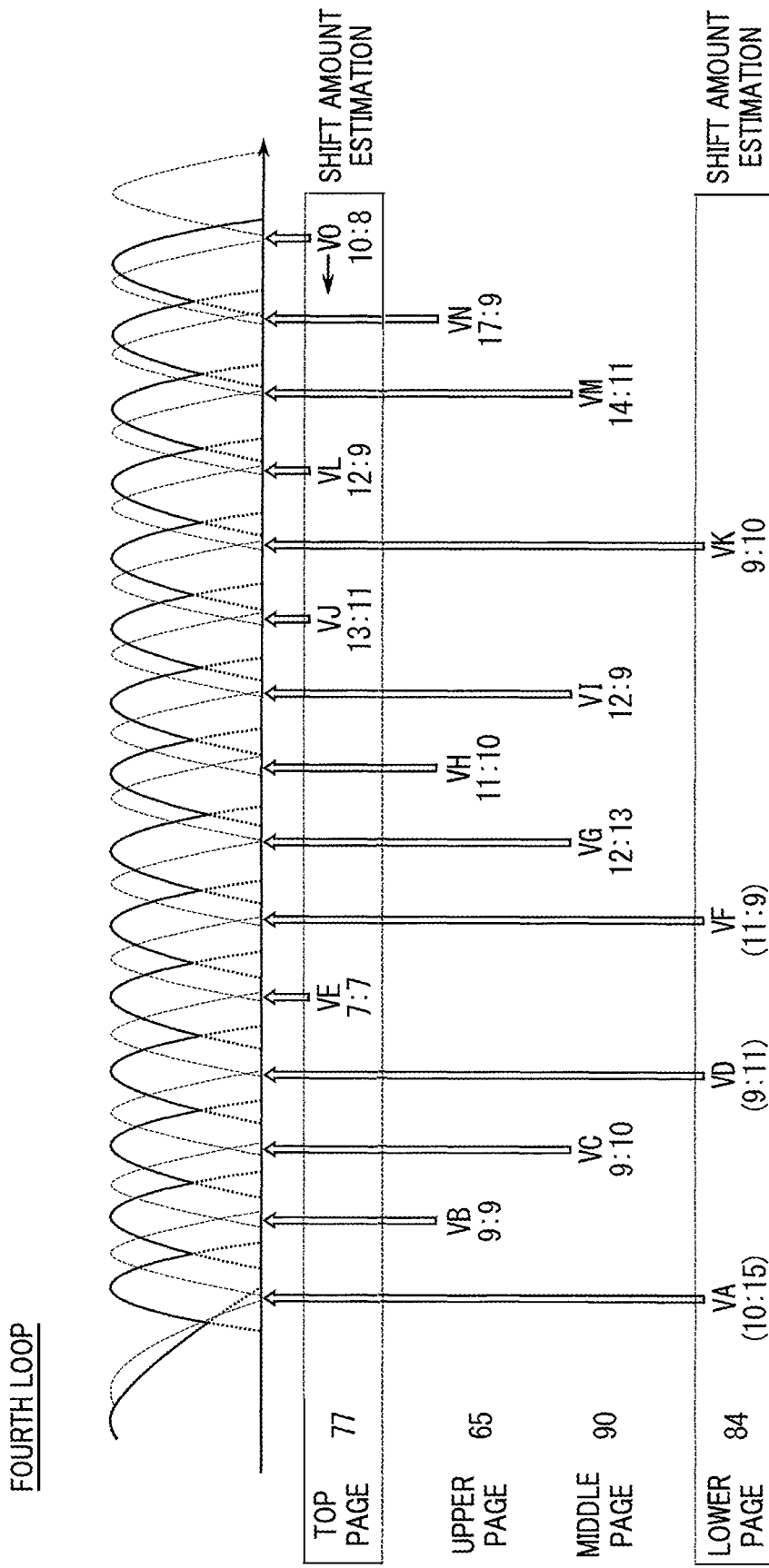
FIG. 14 shows an example of a result of shift amount estimation and a shift read operation in a loop subsequent to the loop of FIG. 13, in the memory controller according to the first embodiment.

Since all the four items of page shift read data are successfully error-corrected in the third loop, read voltages for all of the lower page, the middle page, the upper page, and the top page are subjected to shift amount estimation in step ST23 of the fourth loop shown in FIG. 14. However, an updated shift amount $\Delta$VZr that has already been fixed in the previous loops, and updated shift amounts $\Delta$VZr that correspond to the ratios RAT(Z) found to fall within the third range in the course of step ST23 are not determined. In the example of FIG. 14, the updated shift amount $\Delta$VAr is not estimated, since the ratio RAT(A) falls within the third range.

In step ST24 of the fourth loop, no estimated shift amounts are subjected to the applications.

In step ST25 of the fourth loop, the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr obtained in steps ST23 and ST24 of the fourth loop are used. In step ST25 of the fourth loop, a page for which updated shift amounts $\Delta$VZr have been fixed for all of ZR necessary for determining the data in that page may be excluded from the shift read target. In the example of FIG. 14, the middle-page shift read operation may be omitted in step ST25 of the fourth loop, since the updated shift amounts $\Delta$VCr, $\Delta$VGr, $\Delta$VIr, and $\Delta$VMr for the middle page have already been fixed. Similarly, the upper-page shift read operation may be omitted in step ST25 of the fourth loop, since the updated shift amounts $\Delta$VBr, $\Delta$VHr, and $\Delta$VNr for the upper page have been fixed.

Through use of the updated shift amounts $\Delta$VAr, $\Delta$VBr, $\Delta$VCr, $\Delta$VDr, $\Delta$VEr, $\Delta$VFr, $\Delta$VGr, $\Delta$VHr, $\Delta$VIr, $\Delta$VJr, $\Delta$VKr, $\Delta$VLr, $\Delta$VMr, $\Delta$VNr, and $\Delta$VOr, some ratios RAT(Z) come close to 1, and some values FBC(Z) become lower than the corresponding values FBC(Z) in the third loop.

Unless the loop number N reaches the upper limit (No in step ST31 of FIG. 5), further loops may be executed.

1. 3. Advantages

According to the memory system 5 of the first embodiment, it is possible to efficiently determine updated shift amounts $\Delta$VXr for read operations of a plurality of pages in a cell unit CU. The details will be described below.

In the shift amount estimation of step ST5, it is possible to determine an updated shift amount $\Delta$VXr with high precision in a short period of time. Also, it is known that the updated shift amount $\Delta$V1r for a read voltage V1 has a correlation with an updated shift amount $\Delta$V2r for a read voltage V2, which is positioned close to (e.g., adjacent to) the read voltage V1. Based on this phenomenon, the first embodiment is configured in such a manner that, when read data of a first page in a cell unit CU has been successfully error-corrected, one updated shift amount $\Delta$V1r for the read voltage V1 for the first page is obtained, the obtained updated shift amount $\Delta V1r$ is applied to updated shift amounts $\Delta V2r$ for the read voltage V2 that is adjacent to or two read voltages away from the read voltage V1, and a data read operation and error correction are performed using the estimated and applied updated shift amounts $\Delta V2r$. When there is an item of second page data that is successfully error-corrected for the first time as a result of the error correction, shift amount estimation is performed on the first and second pages, and the processing is repeated in a similar manner. Since the high-precision updated shift amount $\Delta V1r$ for the first page is applied, in the first loop, to the updated shift amount $\Delta V2r$ for the second page that has not been successfully error-corrected, the second page is likely to be successfully error-corrected. In the second loop, more updated shift amounts $\Delta VZr$ with higher precision is obtained by another shift amount estimation on the first page and a shift amount estimation on the second page. By repeatedly executing such loops, it is possible to obtain an increased number of shift amounts $\Delta VZr$ with higher precision as the loops are repeated, thus achieving successful error correction on the read data of all pages in a shorter period of time, and obtaining an updated shift amount $\Delta VXr$.

1. 4. Modification

In the example described above, in step ST24, an updated shift amount $\Delta VZr$ that is not subjected to shift amount estimation in step ST23 and which has not yet been fixed is subjected to application of an adjacent updated shift amount $\Delta VZr$ for a read voltage VZ used to determine data in a successfully error-corrected page whenever the adjacent updated shift amount $\Delta VZr$ is available. However, the embodiment is not limited to this example. A not-yet-fixed updated shift amount $\Delta VZr$ does not need to be subjected to application of an adjacent fixed updated shift amount $\Delta VZr$ even if the adjacent fixed updated shift amount $\Delta VZr$ is available. In this case, such a not-yet-fixed updated shift amount $\Delta VZr$ can be subjected to application of the adjacent fixed updated shift amount $\Delta VZr$ after data in a page to be read using a read voltage VZ corresponding to the not-yet-fixed updated shift amount $\Delta VZr$ is successfully error-corrected. Such a read voltage VZ that is not subjected to application of another adjacent estimated shift amount $\Delta VZt$ until the error correction succeeds may be a read voltage VZ that differs in characteristics (e.g., the amount and/or negative/positive signs, etc.) from another read voltage VZ.

In the example described above, the updated shift amount $\Delta VZr$ for a read voltage VZ obtained in step ST234 is applied only to one or more read voltages VZ that are adjacent to the read voltage VZ for which the to-be-applied updated shift amount $\Delta VZr$ is obtained, in step ST24 shown in FIG. 5. In the modification, applications are performed in a manner different from the above-described example.

Figure 15:
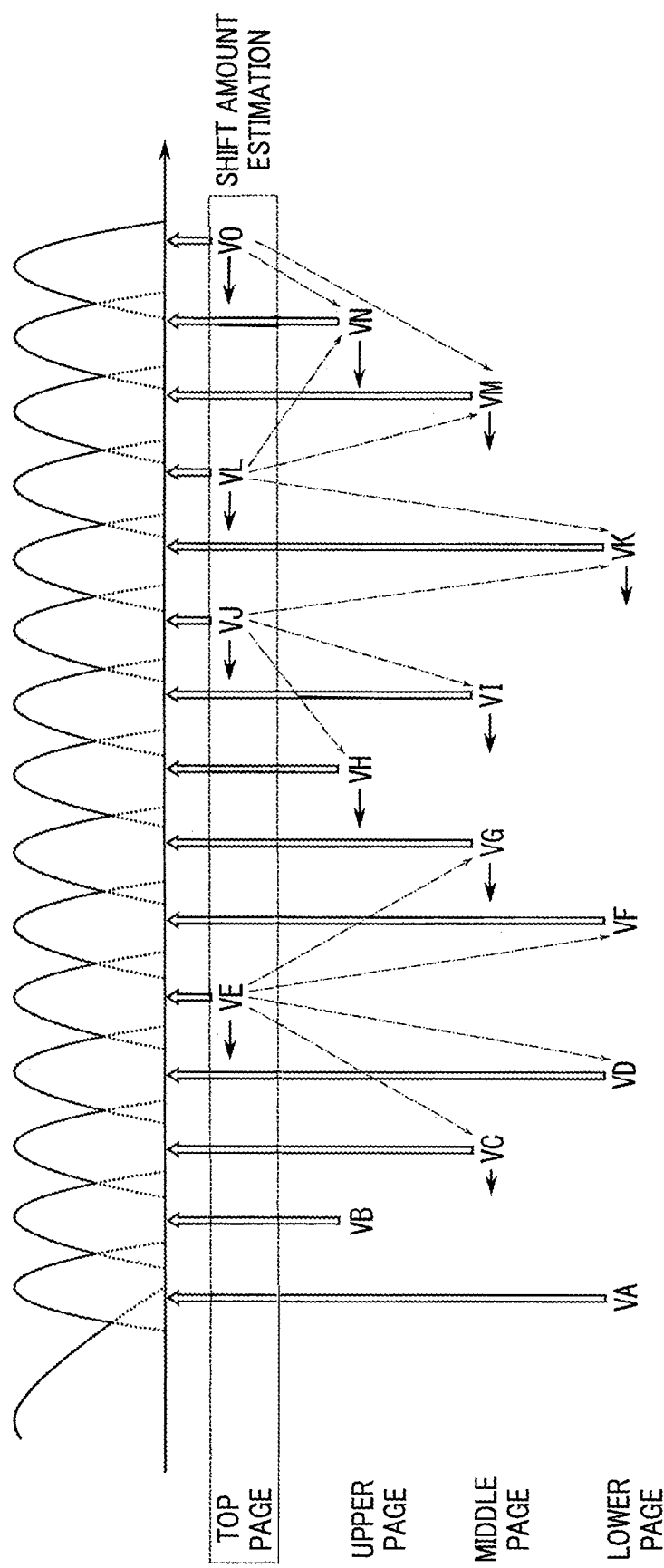
FIG. 15 shows an example of applications of updated shift amounts, according to a modification of the first embodiment.

FIG. 15 shows an example of applications of updated shift amounts $\Delta VZr$ in a memory controller 2, according to a modification of the first embodiment. In the example of FIG. 15, of the four pages in a selected cell unit CU, data in only the top page has been successfully error-corrected. Thus, updated shift amounts $\Delta VEr$, $\Delta VJr$, $\Delta VLr$, and $\Delta VOr$ for read voltages VE, VJ, VL, and VO for the top page are respectively obtained by the shift amount estimation in step ST23.

In the modification, the updated shift amounts $\Delta VEr$, $\Delta VJr$, $\Delta VLr$, and $\Delta VOr$ are applied not only to read voltages VD, VF, VI, VK, VM, and VN adjacent to their corresponding read voltages VE, VJ, VL, and VO, but also to read voltages VC, VG, and VH, which are two read voltages away from their corresponding read voltages, as shown by the dash-dotted lines. That is, the updated shift amount $\Delta VEr$ may be applied not only as updated shift amounts $\Delta VDr$ and $\Delta VFr$, but also as updated shift amounts $\Delta VCr$ and $\Delta VGr$. The updated shift amount $\Delta VJr$ may be applied not only as updated shift amounts $\Delta VIr$ and $\Delta VKr$, but also as an updated shift amount $\Delta VHr$. The updated shift amount $\Delta VLr$ may be applied not only as updated shift amounts $\Delta VKr$ and $\Delta VMr$, but also as an updated shift amount $\Delta VNr$. The updated shift amount $\Delta VOr$ may be applied not only as an updated shift amounts $\Delta VNr$, but also as an updated shift amount $\Delta VMr$.

When there is an applicable updated shift amount $\Delta V13r$ adjacent to an updated shift amount $\Delta V12r$ that is two updated shift amounts away from an applicable updated shift amount $\Delta V11r$, the updated shift amount $\Delta V13r$ may be applied to the updated shift amount $\Delta V12r$, without the updated shift amount $\Delta V11r$ being applied. In the example of FIG. 15, a read voltage VM, which is two read voltages away from the read voltage VO, is adjacent to the read voltage VL on the opposite side. Accordingly, the updated shift amount $\Delta VLr$ is applied as the updated shift amount $\Delta VMr$, and the updated shift amount $\Delta VOr$ does not need to be applied as the updated shift amount $\Delta VMr$.

In addition, a weighted average of updated shift amounts $\Delta VZr$ of read voltages VZ may be applied as an updated shift amount $\Delta VZr$ for another read voltage VZ. For example, for the updated shift amount $\Delta V11r$ for a read voltage V11, an updated shift amount $\Delta V12r$ for a read voltage V12 adjacent to the read voltage V11 and an updated shift amount $\Delta V13r$ for a read voltage V13 adjacent to the read voltage V12 may be used. A mean value of the updated shift amount $\Delta V12r$ multiplied by a weight H1 and the updated shift amount $\Delta V13r$ multiplied by a weight H2(<H1) may be applied to the updated shift amount $\Delta V11r$. In the example of FIG. 16, a mean of the product of the weight H1 and an updated shift amount $\Delta VCr(=-1)$ for a read voltage VC(CR), which is adjacent to a read voltage VD(DR), and the product of the weight H2 and an updated shift amount $\Delta VBr(=2)$ for a read voltage VB(BR), which is two read voltages away from the read voltage VD(DR) may be applied to the updated shift amount $\Delta VDr$ for the read voltage VD(DR).

Moreover, an updated shift amount $\Delta V14r$ for a read voltage V14 opposite to the read voltages V12 and V13, with respect to the read voltage V11, may be further used for the calculation of the mean, and an updated shift amount $\Delta V15r$ for a read voltage V15 adjacent to the read voltage V14 may be further used for the calculation of the mean.

While certain embodiments have been described, these embodiments have been presented by way of example only, and are not intended to limit the scope. Indeed, the novel embodiments described herein may be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

What is claimed is:

1. A memory system comprising:
   a semiconductor memory including a word line and a plurality of memory cells connected to the word line; and
   a memory controller configured to write data in the memory cells, wherein the memory controller configured to:

read data of the memory cells as first data;
perform error correction on the first data; and
determine whether or not to perform a refresh operation of a block based on a number of error bits of the first data, a first number and a second number, the first number representing a number of bits each of which has different values in a first manner between the first data and first expected data obtained by the error correction on the first data, the second number representing a number of bits each of which has different values in a second manner between the first data and the first expected data, the block having the memory cells.

2. The memory system according to claim 1, wherein
each of the memory cells is capable of storing n bit data, n being an integer equal to or larger than 2,
the memory controller is configured to write n pages of data in the memory cells, and
the memory controller is configured to:
  read data of a first page of the n pages as the first data;
  read data of a k-th page of the n pages as k-th data, k being an integer equal to or larger than 2 and being an integer equal to or smaller than n;
  calculate a (2k−1)-th number and a (2k)-th number, the (2k−1)-th number representing a number of bits each of which has different values in the first manner between the k-th data and k-th expected data obtained by error correction on the k-th data, the (2k)-th number representing a number of bits each of which has different values in the second manner between the k-th data and the k-th expected data; and
  determine to perform the refresh operation of the block when a ratio of a the (2j−1)-th number to a (2j)-th number is equal to or smaller than a first value and the number of error bits of the j-th data is larger than a second value, j being an integer equal to or larger than 1 and being an integer equal to or smaller than n.

3. The memory system according to claim 1, wherein
each of the memory cells is capable of storing n bit data, n being an integer equal to or larger than 2,
the memory controller is configured to write n pages of data in the memory cells,
the memory controller is configured to:
  read data of a first page of the n pages as the first data using a first voltage;
  calculate a first shift amount based on the first number and the second number; and
  read data of a second page of the n pages as second data using a second voltage and a second shift amount, the second shift amount being based on the first shift amount.

4. The memory system according to claim 3, wherein the memory controller is configured to read data of the first page as third data using the first voltage and the first shift amount.

5. The memory system according to claim 4, wherein the reading of data as the third data includes causing the semiconductor memory to apply, to the word line, a voltage of a sum of the first voltage and the first shift amount.

6. The memory system according to claim 4, wherein the memory controller is configured to read data of the first page as fourth data using the first voltage and the first shift amount and calculate a third shift amount based on a third number and a fourth number when error correction on the second data fails, the third number representing a number of bits each of which has different values in the first manner between the fourth data and second expected data, the fourth number representing a number of bits each of which has different values in the second manner between the fourth data and the second expected data, the second expected data being obtained by error correction on the fourth data.

7. The memory system according to claim 6, wherein the memory controller is configured to read data of the second page as fifth data using the second voltage and a fourth shift amount based on the third shift amount.

8. The memory system according to claim 3, wherein the memory controller is configured to calculate a fifth shift amount based on a fifth number and a sixth number, the fifth number representing a number of bits each of which has different values in the first manner between the second data and third expected data, the sixth number representing a number of bits each of which has different values in the second manner between the second data and the third expected data, the third expected data being obtained by error correction on the second data.

9. The memory system according to claim 8, wherein the memory controller is configured to read data of the second page as sixth data using the second voltage and the fifth shift amount.

10. The memory system according to claim 9, wherein the reading of data as the sixth data includes causing the semiconductor memory to apply, to the word line, a voltage of a sum of the second voltage and the fifth shift amount.

11. The memory system according to claim 3, wherein
the first number representing a number of bits each of which has different values in the first manner between the first data and the first expected data is a number of memory cells storing seventh data which is read as data having threshold voltages lower than the first voltage and is corrected to data having threshold voltages higher than the first voltage, and
the second number representing a number of bits each of which has different values in the second manner between the first data and the first expected data is a number of memory cells storing eighth data which is read as data having threshold voltages higher than the first voltage and is corrected to data having threshold voltages lower than the first voltage.

12. The memory system according to claim 3, wherein the first shift amount is used as the second shift amount.

13. The memory system according to claim 3, wherein the reading of data as the second data includes causing the semiconductor memory to apply, to the word line, a voltage of a sum of the second voltage and the second shift amount.

14. The memory system according to claim 3, wherein the memory controller is configured to calculate the first shift amount when error correction on the first data succeeds and error correction on ninth data fails, the ninth data being data of the second page being read using the second voltage.

15. The memory system according to claim 3, wherein the memory controller is configured to:
  read data of the second page as tenth data using the second voltage, and
  read the second data using the second voltage and the second shift amount when error correction on the tenth data fails.

16. The memory system according to claim 15, wherein the memory controller is configured to calculate a seventh number and an eighth number, the seventh number representing a number of bits each of which has different values in the first manner between the second data and fourth expected data, the eighth number representing a number of bits each of which has different values in the second manner between the second data and the fourth expected data, the fourth expected data being obtained by error correction on the second data.

17. The memory system according to claim 16, wherein the memory controller is configured to calculate a sixth shift amount based on the seventh number and the eighth number when a ratio of the seventh number to the eighth number is outside a range.

18. The memory system according to claim 17, wherein the memory controller is configured to read data of the second page using the second voltage and the sixth shift amount.

* * * * *